United States Patent [19]
Noda

[11] 4,353,000
[45] Oct. 5, 1982

[54] DIVIDER CIRCUIT

[75] Inventor: Masaru Noda, Fujisawa, Japan

[73] Assignee: Hitachi, Ltd., Tokyo, Japan

[21] Appl. No.: 49,084

[22] Filed: Jun. 18, 1979

[30] Foreign Application Priority Data

Jun. 16, 1978 [JP] Japan ................................ 53/72839
Jun. 16, 1978 [JP] Japan ................................ 53/72840
Jun. 16, 1978 [JP] Japan ................................ 53/72841

[51] Int. Cl.³ .................. H03G 3/00; G06G 7/12; G06G 7/20
[52] U.S. Cl. .................... 307/490; 307/492; 307/493; 328/144; 328/161
[58] Field of Search .......... 307/229, 230, 494, 490, 307/492, 493; 328/161, 144, 145

[56] References Cited
U.S. PATENT DOCUMENTS 3,852,688 12/1974 Takeda ................. 328/145
4,001,602 1/1977 Birchenough ........... 328/161
4,045,494 8/1977 Ahmed ................. 307/494

Primary Examiner—Stanley D. Miller, Jr.
Assistant Examiner—B. P. Davis
Attorney, Agent, or Firm—Antonelli, Terry & Wands

[57] ABSTRACT

An electronic divider circuit for processing first and second electrical signals A and B. The second electrical signal B is divided by the first electrical signal A, thereby producing a third electrical signal B/A. This divider circuit is configured very easily by a combination of differential amplifiers and is suitable for construction with integrated circuits.

14 Claims, 24 Drawing Figures

DIVIDER CIRCUIT

BACKGROUND OF THE INVENTION

The present invention relates to an electronic circuit, or more in particular to a divider circuit for dividing a signal B by a signal A, which is an electronic circuit suitable for use with signal processing circuits of a television receiver or the like.

Many electronic circuit devices are provided with a calculation or operation circuit for adding, subtracting, multiplying or dividing various signals processed in such circuits. Of these calculation circuits, the adder and the subtractor circuits are easily constructed with a circuit network including resistors or differential amplifiers. Also, the multiplier circuit is formed with relative ease by a circuit called an analog multiplier including a combination of differential amplifiers. However, it is not easy to construct a divider circuit. The conventional electronic circuit devices, therefore, are so designed as to eliminate the divider circuit as far as possible. In spite of this, there is a case in which a divider circuit is indispensable.

In the television receiver, for instance, the high frequency component of the luminance signal may be required to be divided by the low-frequency component of the luminance signal. It is well known that in the television broadcast of NTSC system, the band width of the luminance signal is 4.5 MHz while the band width of a chrominance signal is at most 1.5 MHz. In other words, the band width of the chrominance signal is narrower than that of the luminance signal, and the signal components of 1.5 MHz or higher are eliminated. In an ordinary television receiver, therefore, detailed parts of a picture can be reproduced with the luminance signal, while it is impossible to do so with the chrominance signal. If the band width of the chrominance signal is 4.5 MHz, it is of course possible to reproduce accurately the colors of the detailed parts of a picture with the chrominance signal as with the luminance signal.

The low frequency components of the chrominance signal and the luminance signal have a considerable correlation, and therefore it is also assumed that the high frequency component of the luminance signal has a correlation with that of the chrominance signal. Assuming that the luminance signal is divided into the low frequency component $Y_L$ of 1.5 MHz or lower and the high frequency component $Y_H$ of 1.5 MHz or higher, it may be possible to synthesize a high frequency component $C_H$ of the chrominance signal C. In other words, if the ratio between the low frequency component $Y_L$ of the luminance signal and the high frequency component $Y_H$ thereof is equal to the ratio between the chrominance signal C and the high frequency component $C_H$ thereof, $C_H=(Y_H/Y_L)\cdot C$ thus making it possible to synthesize the high frequency component $C_H$ of the chrominance signal. If the high frequency component $C_H$ of the chrominance signal is thus composed, a chrominance signal with 4.5 MHz of band can be obtained as in the case of luminance signal by adding the high frequency component $C_H$ of the chrominance signal to the chrominance signal C. In order to synthesize the high frequency component $C_H$ of the chrominance signal in the manner mentioned above, however, the high frequency component $Y_H$ of the luminance signal is required to be divided by the low frequency component $Y_L$ of the luminance signal. For this purpose, a divider circuit is required.

In the system of the prior art for dividing a signal B by a signal A, the signals A and B are first converted into signals logA and logB by a logarithmic circuit, and then the signals logA and logB are converted into a signal (logB−logA) by a subtracter circuit. Since the signal (logB−logA) is equal to a signal logB/A, it is possible to produce the signal B/A by converting the signal (logB−logA) into an antilogarithm through an index circuit. Thus the signal B/A which is the result of dividing the signal B by signal A is obtained. Nevertheless, the logarithm circuit and the index circuit are complex, and a complicated adjusting circuit is required if these logarithm circuit and the index circuit are to be operated accurately.

SUMMARY OF THE INVENTION

Accordingly, it is an object of the present invention to provide a divider circuit which is simple in construction and high in accuracy, and easy to fabricate in integrated circuits.

According to the present invention, there is provided a divider circuit comprising a variable gain circuit in which the value of the output signal is kept constant regardless of the value of an input signal A, i.e., the gain K is expressed as $K=C/A$ (C: constant), and means for multiplying a signal B with the gain K by use of the change in the gain K and generating a signal proportional to the signal B/A. In other words, the calculation below is accomplished.

$$K\cdot B = (C/A)\cdot B = C\cdot(B/A)$$

Specifically, according to the present invention, first and second variable gain circuits of the same type are used. The gain of the variable gain circuits is changed by a control voltage. Since they are of the same type, the gain $K_1$ of the first variable gain circuit is equal to the gain $K_2$ of the second variable gain circuit if the control voltage $V_1$ of the first variable gain circuit is equal to the control voltage $V_2$ of the second variable gain circuit. Assuming that input signals A and B are applied to the first and second variable gain circuits respectively, output signals $I_1$ and $I_2$ produced therefrom take the form of $K_1A$ and $K_2B$ respectively. Thus, if $K_1=K_2$, $I_2=(I_1/A)\cdot B$. If it is possible to maintain the output signal $I_1$ of the first variable gain circuit constant, therefore, the output signal $I_2$ of the second variable gain circuit should be proportional to the value B/A. In view of the fact that the gain $K_1$ is changed by the control voltage $V_1$ as described above, the output signal $I_1$ is maintained constant if the control voltage $V_1$ is changed in such a manner that the gain $K_1$ is the reciprocal 1/A of the signal A. In order to maintain the output signal $I_1$ constant at the value C, for instance, the output voltage corresponding to the output signal $I_1$ is fed back as a control voltage $V_1$. In other words, the signal A is applied to the first variable gain circuit, and a voltage corresponding to the output signal $I_1=K_1A$ of the first variable gain circuit is fed back as a control voltage $V_1$, thus rendering the gain $K_1=C/A$. As a result, the relation $K_2=K_1=C/A$ is obtained if a voltage corresponding to the output signal $I_1$, i.e., the control voltage $V_1$ is supplied as the control voltage $V_2$ for the second variable gain circuit. In this way, the output signal $I_2$ of the second variable gain circuit takes the form of $I_2=C\cdot(B/A)$, which is a signal B divided by signal A.

DETAILED DESCRIPTION OF THE PREFERRED EMBODIMENTS

Figure 1A:
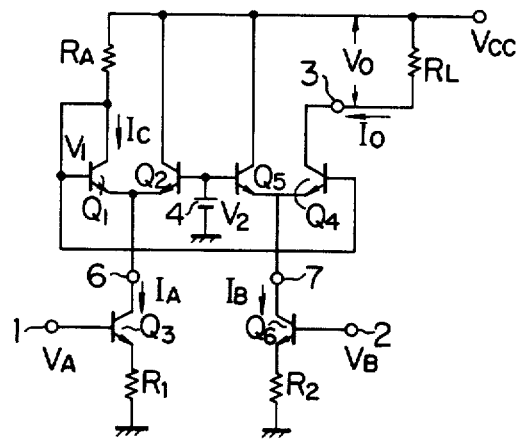
FIG. 1a is a circuit diagram showing a first embodiment of the present invention.

FIG. 1a is a circuit diagram for explaining the first embodiment of the present invention. In this drawing, reference characters R with a postfix show resistors and the resistance value thereof at the same time. The reference characters Q with postfix show transistors. Arrows in the drawing show the current flowing in particular branches and the direction thereof.

Transistors $Q_1$ and $Q_2$ make up a first variable gain circuit. The emitters of the transistors $Q_1$ and $Q_2$ are connected to each other on the one hand and to the input terminal 6 of the signal A and the collector of the input transistor $Q_3$ on the other hand. The emitter of the transistor $Q_3$ is grounded via a resistor $R_1$. The base of the transistor $Q_2$ is connected to a fixed voltage source 4 and supplied with a constant voltage $V_2$. The base of the transistor $Q_1$ makes up a gain control terminal of this variable gain circuit and is connected to the collector of the transistor $Q_1$. The collector of the transistor $Q_1$ is connected to a power supply Vcc through the resistor $R_4$. The base of the transistor $Q_3$, i.e., the terminal 1 is supplied with the signal A, and therefore the collector current $I_A$ of the transistor $Q_3$ takes form of an input signal corresponding to the signal A. In the first variable gain circuit, assume that the collector current of the transistor $Q_1$ is $I_C$ and the base voltage of the transistor $Q_1$ is $V_1$, and then the collector current $I_C$ of the transistor $Q_1$ is expressed by equation (1) as well known.

$$I_C = \frac{\alpha}{1 + \epsilon^{\frac{q(V_2 - V_1)}{kT}}} \cdot I_A \tag{1}$$

where $\alpha$ is the current amplification factor of the transistors $Q_1$ and $Q_2$ which is substantially equal to 1, q is the amount of electron charges which is $1.60206 \times 10^{-19}$ coulombs, k is the Boltzmann factor which is $1.38044 \times 10^{-23}$ joule/°K., and T the absolute temperature.

In equation (1), $$\frac{\alpha}{1 + \epsilon^{\frac{q(V_2 - V_1)}{kT}}}$$

is replaced by K. Then, $$I_C = K \cdot I_A \tag{3}$$

It is thus seen that the collector current $I_C$ of the transistor $Q_1$ is equal to a value K times the collector current $I_A$ of the transistor $Q_3$, the factor K showing the gain. The factor K changes with the voltage $V_1$, and therefore the transistors $Q_1$ and $Q_2$ surely make up a variable gain circuit.

Figure 2:
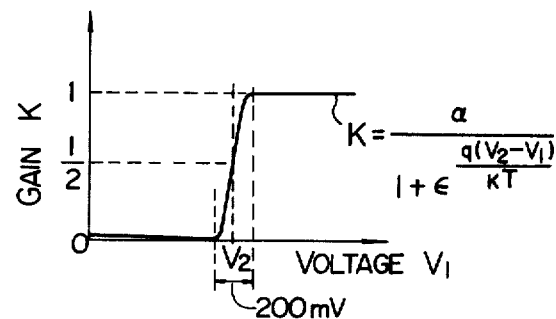
FIG. 2 is a characteristics diagram showing the relation between the gain K and the voltage $V_1$.

Equation (3) is illustrated in FIG. 2 where the abscissa represents the voltage $V_1$ and the ordinate the gain K. As obvious from FIG. 2, the gain K changes very sharply with the voltage $V_1$ at or about the voltage $V_2$, so that the very small change in the voltage $V_1$ by $\pm 100$ mV around the voltage $V_2$ causes the gain K to change almost from 0 to 1. Thus when the current $I_A$ changes, a slight change in the voltage $V_1$ causes a great change in the gain K, showing the possibility to maintain the current $I_C$ substantially constant at C. The gain of course cannot be more than 1, so that the relation between the currents $I_A$ and $I_C$ must be $I_A \geq I_C = C$.

According to the present invention, the current $I_C$ is maintained at a constant value C in such a way that the collector of the transistor $Q_1$ is connected to the base thereof and the collector voltage of the transistor $Q_1$ is fed back entirely to the base. In this circuit, assuming that the collector current $I_A$ of the transistor $Q_3$ increases, the collector current $I_C$ of the transistor $Q_1$ also increases. With the increase the the collector current $I_C$, however, the voltage $E_{RA}$ across the resistor $R_A$ increases and the base voltage $V_1$ of the transistor $Q_1$ decreases, so that the gain K is reduced, thus preventing the collector current $I_C$ from increasing. In the case where the current $I_A$ is decreased, on the other hand, the voltage $V_1$ increases, and therefore the decrease in the current $I_C$ is prevented. In other words, the voltage $V_1$ changes automatically in a manner to maintain the current $I_C$ constant at value C. Automatic control is possible if the amount of change in the voltage $V_1$ i.e., the amount of change in the collector voltage of the transistor $Q_1$ is within ±100 mV as mentioned above. This amount of change is equal to the amount of change in the voltage $E_{RA}$ across the resistor $R_A$, and therefore by setting the value of the voltage $E_{RA}$ ($=R_A \cdot I_C$) at a value of 1 V or higher, the amount of change in the current $I_C$ is controlled within ±100 mV/1 V = ±0.1 V, i.e., within ±10%. If the voltage $E_{RA}$ ($=R_A \cdot I_C$) across the resistor $R_A$ is increased, the amount of change in the current $I_C$ is lessened. In this circuit, the voltage $E_{RA}$ ($=R_A \cdot I_C$) across the resistor $R_A$ is dependent on the base voltage $V_2$ of the transistor $Q_2$, and therefore $E_{RA} \approx V_{cc} - V_2$. As a result, the value of the current $I_C$ is given as $$I_C(=C) \approx (V_{cc} - V_2)/R_A \quad (4)$$

As will be seen from above, the gain K is inversely proportional to the current $I_A$. Therefore, a signal proportional to $I_B/I_A$ should be obtained by multiplying the gain K by the current $I_B$. Since the gain K is capable of being converted into the voltage $V_1$ as shown in FIG. 2, the change in the gain K is taken out as a change in the voltage $V_1$, and the voltage $V_1$ is applied to an appropriate circuit where it is converted again into the gain K and multiplied by the current $I_B$, thus producing a signal proportional to $I_B/I_A$. Next, explanation will be made of the circuit for reconversion into the gain K.

By the way, K is 1 or smaller as mentioned above, and therefore the equation below is obtained from the relation of equations (3) and (4).

$$R_A \geq (V_{cc} - V_2)/I_{Amin.} \quad (5)$$

where the current $I_{Amin.}$ is the minimum value of the current $I_A$ flowing in the collector of the transistor $Q_3$ in response to the signal A, and the resistor $R_A$ is required to be determined at a proper value satisfying the equation (5). Also, if the resistor $R_A$ is determined to satisfy equation (5), the current $I_C$ is substantially maintained constant at C.

The transistors $Q_4$ and $Q_5$ are formed in the same manner as in the first variable gain circuit, and make up a second variable gain circuit. More specifically, the emitters of the transistors $Q_4$ and $Q_5$ are connected to each other on the one hand and to the terminal 7 and further to the collector of the transistor $Q_6$ on the other hand. The emitter of the transistor $Q_6$ is grounded through the resistor $R_2$. The base of the transistor $Q_6$, i.e., the terminal 2 is impressed with the signal B, so that the collector current $I_B$ of the transistor $Q_6$ is a signal corresponding to the signal B. The base of the transistor $Q_5$ is connected to a voltage source 4 and maintained at the same constant voltage $V_2$ as the base voltage of the transistor $Q_2$. The base of the transistor $Q_4$ makes up a gain control terminal of the second variable gain circuit and is connected to the base of the transistor $Q_1$ to receive the voltage $V_1$. The collector of the transistor $Q_4$ is connected to the output terminal 3, and a load resistor $R_L$ is connected between the output terminal 3 and the power supply Vcc. In this second variable gain circuit, assume that the current $I_O$ flows at the output terminal 3, i.e., the collector current of the transistor $Q_4$ flows at the terminal 3. The current $I_O$ is expressed by equation (6).

$$I_O = \frac{\alpha}{1 + \epsilon^{\frac{q(V_2 - V_1)}{kT}}} \cdot I_B \quad (6)$$

Comparison of equation (6) with equation (1) shows that the term $$\frac{\alpha}{1 + \epsilon^{\frac{q(V_2 - V_1)}{kT}}}$$

is the same in both equations. This fact is established when the current amplification factors $\alpha$ of the transistors $Q_1$, $Q_2$, $Q_3$, $Q_4$ and the base-emitter voltage $V_{be}$ thereof are all equal to each other. This condition is achieved with relative ease in the cse of integrated circuits in which the transistors $Q_1$, $Q_2$, $Q_3$ and $Q_4$ are formed in proximity to each other on the same semiconductor substrate. By using equation (2), the equation (6) is alternatively given as equation (7) below.

$$I_O = K \cdot I_B \quad (7)$$

Further, from equation (3), $K = I_c/I_A = C/I_A$, and therefore equation (8) below is obtained.

$$I_O = C \cdot (I_B)/I_A \quad (8)$$

Thus the current $I_O$ is proportional to the value $I_B/I_A$ and makes up a signal which is obtained by dividing the signal $I_B$ by signal $I_A$. In other words, the voltage $V_1$ supplied from the first variable gain circuit in this circuit is converted into the gain K, which in turn is multiplied by the current $I_B$.

Although the equation (8) shows a division of current, this is easily replaced by a division of a voltage. Since the emitter voltages of the transistors $Q_3$ and $Q_6$ are $I_A \cdot R_1$ and $I_B \cdot R_2$ respectively, the equations below are obtained.

$$V_A = I_A \cdot R_1 + V_{be} \quad (9)$$

$$V_B = I_B \cdot R_2 + V_{be}$$

where $V_A$ is the voltage at the input terminal 1 and $V_B$ the voltage at the input terminal 2. Thus, $$I_A = \frac{V_A - V_{be}}{R_1} \quad (10)$$

$$I_B = \frac{V_B - V_{be}}{R_2}$$

The voltage drop across the load resistor $R_L$ connected between the output terminal 3 and the power supply $V_{cc}$, i.e., the output voltage $V_O$ is given by equation (11) below.

$$V_O = I_O \cdot R_L \quad (11)$$

From equations (8), (10) and (11), equation (12) is given.

$$V_O = C \cdot R_L \cdot \frac{R_1}{R_2} \cdot \frac{V_B - V_{be}}{V_A - V_{be}} \quad (12)$$

Equation (12) includes the base-emitter voltage $V_{be}$, which can be neglected if the voltage $V_{be}$ is added to the input signal voltages $V_A$ and $V_B$ in advance. Therefore, the output voltage $V_O$ is given as $$V_O = L \cdot (V_B)/V_A) \quad (13)$$

where $L = C \cdot R_L \cdot (R_1)/R_2$.

This voltage represents the input voltage $V_B$ divided by the input voltage $V_A$.

Figure 3:
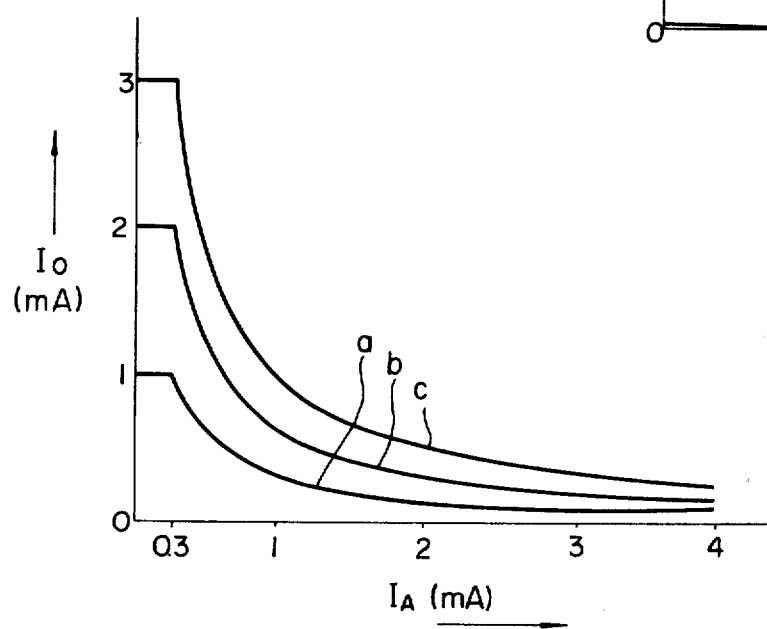
FIG. 3 is a characteristics diagram in which the current of the input signal A and the current of the output signal are shown with the current of the input signal B as a parameter in the first embodiment.

The characteristics of the circuit according to the embodiment of FIG. 1a are shown in FIG. 3, where $V_{cc} = 12$ V, $V_2 = 9$ V, $R_A = 10$ KΩ, $R_1 = 1$ KΩ and $R_2 = 1$ KΩ. In FIG. 3, the abscissa shows the current $I_A$ in mA, and the ordinate the output current $I_O$ in mA. Curves a, b and c are associated with the current $I_B$ of 1 mA, 2 mA and 3 mA respectively. Each curve is a hyperbola and it is seen that the output current $I_O$ is proportional to $1/I_A$ accurately. If the current $I_A$ is fixed at, say, 1 mA, the current $I_O$ is substantially proportional to the current $I_B$. Thus the current $I_O$ is proportional to $I_B/I_A$. At the current $I_A$ below about 0.3 mA, the current $I_O$ is kept constant. This is for the reason that with the decrease in the current $I_A$, the condition $I_A \geq C \approx (V_{cc} - V_2)/R_A$ mentioned above cannot be satisfied. When the constant value C is determined from $V_{cc} = 12$ V, $V_2 = 9$ V and $R_A = 10$ KΩ, for example, $C \approx 0.3$ mA, which is very coincident with the characteristics of FIG. 3. In this design, therefore, the minimum value $I_{Amin}$ the current $I_A$ operating as a divider circuit is 0.3 mA.

In the embodiment of FIG. 1a, the transistor $Q_1$ has the base and collector thereof connected to each other. This is considered as a diode configuration in which the base and collector is replaced by an anode and the emitter by a cathode. Therefore, the transistor $Q_1$ may be replaced by a diode with virtually equal effect.

Figure 1B:
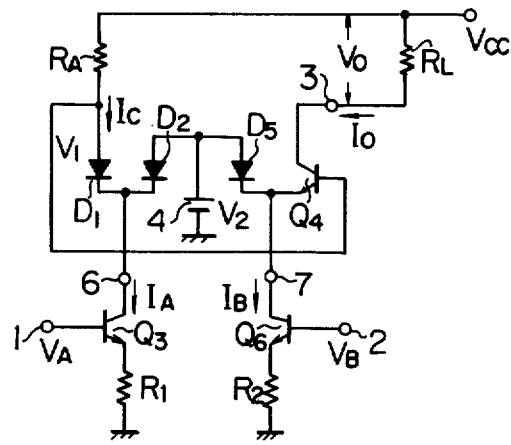
FIG. 1b is a circuit diagram showing a modification of the first embodiment.

The transistors $Q_2$ and $Q_3$ have their collectors connected to the power supply $V_{cc}$. These collectors may alternatively be connected to other voltage source on the condition that the transistors $Q_2$ and $Q_3$ are not saturated. As an example, the collectors thereof may be connected to the fixed voltage source 4 to which the bases of the transistors $Q_2$ and $Q_5$ are connected. In this case, the base and collector of the transistors $Q_2$ and $Q_5$ are connected with each other. Thus each of the transistors may be considered to be a single diode with an anode made up of the base and collector and a cathode made up of the emitter, so that each of the transistors $Q_2$ and $Q_5$ may be replaced by a diode with the anode thereof connected to the fixed voltage source 4 with a virtually equal effect. A circuit where the transistors $Q_1$, $Q_2$ and $Q_5$ are replaced by diodes $D_1$, $D_2$ and $D_5$ respectively is shown in FIG. 1b. Also, in the embodiment of FIG. 1a, the collector of the transistor $Q_1$ is connected directly to the base thereof. In place of this configuration, either a resistor or a diode may be used to connect the collector and the base of the transistor $Q_1$. In short, it suffices if a feedback circuit from the collector to the base of the transistor $Q_1$ is provided. It is also of course possible to connect a feedback path with a properly-designed amplifier between the collector and base of the transistor $Q_1$. Further, the resistor $R_A$ may be replaced by an active load such as a constant current source.

Figure 4:
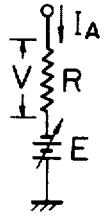
FIG. 4 is a circuit diagram showing an input circuit.

The input transistor $Q_3$ or $Q_6$ may be replaced by the input circuit as shown in FIG. 4. In this case, the voltage E is controlled by the signal input $V_A$ or $V_B$ thereby to attain the current flow of $I_A$ or $I_B$ as the case may be. The value of the resistor R, however, must be set in such a manner that the voltage drop across it is sufficiently large as compared with the range of change in the voltage $V_1$ (100 mA).

As explained above, according to the present invention, the dividing operation of the signals A and B is accomplished accurately with a simple circuit impossible by the prior art. It is thus easy to achieve the operating accuracy of 10% or less in error. Also, if third and fourth variable gain circuits corresponding to the second variable gain circuit in the embodiment of FIG. 1a are added and the bases of the transistors corresponding to the transistors $Q_4$ and $Q_5$ are connected to the bases of the corresponding transistors $Q_1$ and $Q_2$ so that signals C, D, E and so on are applied to the bases of the transistors, then the calculations of C/A, D/A and so on are also performed in addition to the calculation of B/A. Further, if the signal B is kept constant at a DC voltage with the current $I_B$ at a fixed value, it is possible to produce a signal represented by 1/A. In the foregoing description, the transistors used are of NPN type, which may be course be replaced with equal effect by PNP transistors or other active elements such as field effect transistors.

Figure 5A:
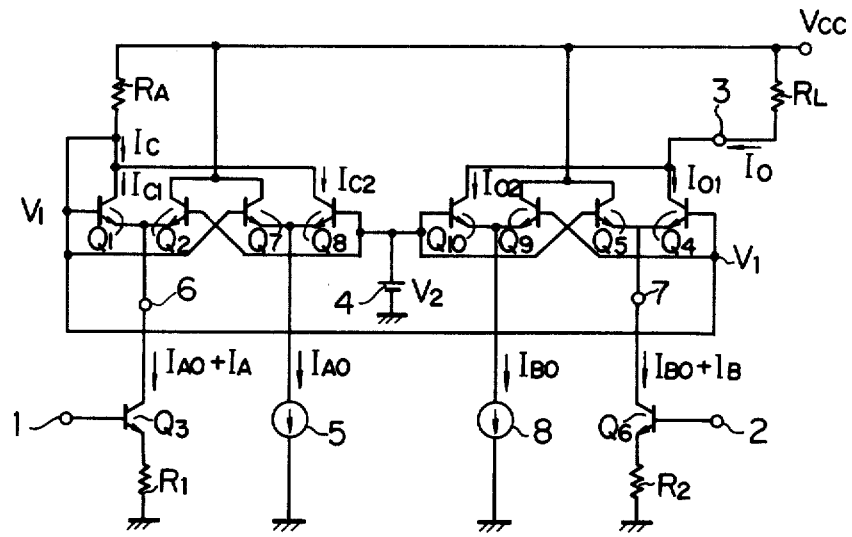
FIG. 5a is a circuit diagram showing a second embodiment of the present invention.

The diagram of FIG. 5a shows a circuit of the second embodiment of the present invention. This embodiment is a circuit for dividing only the signal component in the case where the signal A or B contains a DC bias or the like. In FIG. 5a, the transistors $Q_1$ and $Q_2$ make up a first variable gain circuit as in the first embodiment, and the emitters thereof are connected to each other on the one hand and further to the collector of the transistor $Q_3$ on the other hand.

The emitter of the transistor $Q_3$ is grounded through the resistor $R_1$, the base of the transistor $Q_3$ is connected to the first input terminal 1, and the input terminal 1 is supplied with the signal A. The base of the transistor $Q_2$ is connected to the fixed voltage source 4 and supplied with the constant voltage $V_2$. The base of the transistor $Q_1$ is connected to the collector of the transistor $Q_1$. The collector of the transistor $Q_1$ is connected to the power supply $V_{cc}$ through the load resistor $R_A$.

The transistors $Q_7$ and $Q_8$ make up a first DC bias offsetting (cancel) circuit including a variable gain circuit, and they are connected as mentioned below. The emitters of the transistors $Q_7$ and $Q_8$ are connected with each other and further connected to a constant current source 5. The base of the transistor $Q_7$ is connected to the base of the transistor $Q_1$ of the first variable gain circuit, and the base of the transistor $Q_8$ is connected to the base of the transistor $Q_2$. The collector of the transistor $Q_8$ is connected to the collector of the transistor $Q_1$. Therefore, the gain of the DC bias offsetting circuit changes with the gain of the first variable gain circuit.

Now assume that the collector current of $(I_{AO} + I_A)$ flows in the transistor $Q_3$, where $I_A$ is the signal current component which takes a positive value, and $I_{AO}$ is the DC bias current. Let $I_{C1}$ be the collector current of the transistor $Q_1$, $I_{C2}$ be the collector current of the transistor $Q_8$, and $I_C$ be the sum of the two currents, and assume that the current flowing in the constant current source 5 is equal to the current $I_{AO}$. Also, assume that the base voltage of the transistors $Q_1$ and $Q_7$ is $V_1$. Then the collector current $I_{C1}$ of the transistor $Q_1$ and the collector current $I_{C2}$ of the transistor $Q_6$ are given by equations (14) and (15) as well known.

$$I_{C1} = \frac{\alpha}{1 + \epsilon^{\frac{q(V_2 - V_1)}{kT}}} \cdot (I_{AO} + I_A) \quad (14)$$

$$I_{C2} = \frac{\alpha}{1 + \epsilon^{\frac{-q(V_2 - V_1)}{kT}}} \cdot I_{AC} \quad (15)$$

Thus the sum $I_C$ of the currents $I_{C1}$ and $I_{C2}$ is expressed by an equation (16) below.

$$I_C = I_{C1} + I_{C2} = \quad (16)$$

$$\left( \frac{1}{1 + \epsilon^{\frac{q(V_2 - V_1)}{kT}}} + \frac{1}{1 + \epsilon^{\frac{-q(V_2 - V_1)}{kT}}} \cdot \alpha \cdot I_{AO} \right) +$$

$$\frac{\alpha}{1 + \epsilon^{\frac{q(V_2 - V_1)}{kT}}} \cdot I_A = \alpha \cdot I_{AO} + \frac{\alpha}{1 + \epsilon^{\frac{q(V_2 - V_1)}{kT}}} \cdot I_A$$

Using the gain K defined in equation (2), the current $I_C$ is given as below.

$$I_C = \alpha \cdot I_{AO} + K \cdot I_A \quad (17)$$

In equation (17), the current amplification factor $\alpha$ and the DC bias current $I_{AO}$ are constant, and therefore it is possible to maintain the current $I_C$ as constant value C by changing the voltage $V_1$ slightly even when the current $I_A$ changes as in the first embodiment. Also, it is obvious from equation (17) that the currents $I_{AO}$ and $I_A$ are independent of each other, so that the DC bias $I_{AO}$ and the signal current $I_A$ can be handled separately from each other.

By the way, the resistor $R_A$ in this embodiment must satisfy the relation $$B_A \geq (V_{cc} - V_2)/(I_{Amin.} + \alpha \cdot I_{AO}) \quad (18)$$

Also, since the gain K is not larger than 1, it is required that $I_A \geq C - \alpha I_{AO}$ from equation (17).

Next, explanation will be made of the circuit including transistors $Q_4$, $Q_5$, $Q_6$, $Q_9$ and $Q_{10}$. The emitters of the transistors $Q_4$ and $Q_5$ making up the second variable gain circuit are connected to each other on the one hand and to the collector of the transistor $Q_6$ on the other hand. The base of the transistor $Q_8$ is connected to the input terminal 2 supplied with the signal B. The base of the transistor $Q_5$ is connected to the fixed power supply 4 and fixed at the voltage $V_2$ which is equal to the base voltage of the transistor $Q_2$. The base of the transistor $Q_4$ is connected to the base of the transistor $Q_1$ and supplied with the same voltage $V_1$ as the base voltage of the transistor $Q_1$. In other words, the gain of the second variable gain circuit changes with the gain of the first variable gain circuit. The collector of the transistor $Q_4$ is connected to the output terminal 3, and the load resistor $R_L$ is inserted between the output terminal 3 and the power supply $V_{cc}$. The transistors $Q_9$ and $Q_{10}$ make up a second DC bias offsetting circuit and are connected as mentioned below. The emitters of the transistors $Q_9$ and $Q_{10}$ are connected with each other on the one hand and to a constant current source 8 on the other hand. The base of the transistor $Q_7$ is connected to the base of the transistor $Q_4$, while the base of the transistor $Q_{10}$ is connected to the base of the transistor $Q_5$. The collector of the transistor $Q_{10}$ is connected to the collector of the transistor $Q_4$.

In the above-mentioned second variable gain circuit and the second DC bias offsetting circuit, assume that the collector current $(I_{BO} + I_B)$ flows in the transistor $Q_8$, where $I_{BO}$ is the DC bias current or the like and $I_B$ is the signal current component. In this case, the current $I_B$ may be either positive or negative, but the relation $(I_{BO} + I_B) \geq 0$ must be established. Also, let $L_{01}$ be the collector current of the transistor $Q_4$, $I_{02}$ be the collector current of the transistor $Q_{10}$, and $I_0$ be the sum of the two currents, i.e., the current flowing at the output terminal 3, and assume that the current flowing at the constant current source 8 is equal to the current $I_{BO}$. Since the base voltage of the transistors $Q_4$ and $Q_9$ is $V_1$ and the base voltage of the transistors $Q_5$ and $Q_{10}$ is $V_2$, the currents $I_{01}$ and $I_{02}$ are expressed by equations (19) and (20) as well known.

$$I_{01} = \frac{\alpha}{1 + \epsilon^{\frac{q(V_2 - V_1)}{kT}}} \cdot (I_{BO} + I_B) \quad (19)$$

$$I_{02} = \frac{\alpha}{1 + \epsilon^{\frac{-q(V_2 - V_1)}{kT}}} \cdot I_{BO} \quad (20)$$

Thus the current $I_0$ which is the sum of currents $I_{01}$ and $I_{02}$ is given by equation (21) below.

$$I_0 = \alpha \cdot I_{BO} + \frac{\alpha}{1 + \epsilon^{\frac{q(V_2 - V_1)}{kT}}} \cdot I_B \quad (21)$$

By using the gain K defined in equation (2), the current $I_0$ is expressed by equation (22) below.

$$I_0 = \alpha \cdot I_{BO} + K \cdot I_B \quad (22)$$

As in equation (17), the bias current $I_{BO}$ and the signal current $I_B$ are independent of each other in equation (22). Assume that $I_C = C$ in equation (17), then $$K = (C - \alpha \cdot I_{AO})/I_A$$

therefore $$I_0 = \alpha \cdot I_{BO} + (C - \alpha \cdot I_{AO}) \cdot (I_B)/I_A \quad (23)$$

In this equation (23), the product of the current amplification factor $\alpha$ and the bias current $I_{BO}$ is the DC component taking a constant value, and therefore can be eliminated as the bias current in the ordinary electronic circuit. Also, the difference between the constant value C and the product $\alpha I_{AO}$ of the current amplification factor $\alpha$ and the bias current $I_{AO}$, i.e., $C - \alpha I_{AO}$ is constant, so that the current $I_0$ shows the result of dividing the $I_B$ by the current $I_A$, i.e., $I_B/I_A$. In other words, the dividing operation of the signal currents $I_A$ and $I_B$ containing no bias current is possible according to this embodiment. The equation (23) representing the dividing operation of the currents may be easily replaced by another equation given by voltages at the terminals 1, 2 and 3. Specifically, the emitter voltages of the transistors $Q_3$ and $Q_6$ are $(I_{AO} + I_A) \cdot R_1$ and $(I_{BO} + I_B) \cdot R_2$ respectively. Assume that the voltages at terminals 1 and 2 are ($V_{AO}+V_A$) and ($V_{BO}+V_B$) respectively. If the voltages $V_{AO}$ and $V_{BO}$ are considered to be DC bias components and the voltages $V_A$ and $V_B$ to be signal components, then the voltages $V_A$ and $V_B$ are given as $I_A \cdot R_1$ and $I_B \cdot R_2$ respectively. Thus the currents $I_A$ and $I_B$ are given by equation (29) by using the signal voltages $V_A$ and $V_B$ at the terminals 1 and 2 respectively.

$$I_A = \frac{V_A}{R_1} \qquad (24)$$

$$I_B = \frac{V_B}{R_2}$$

On the other hand, the voltage drop across the load resistor $R_L$ connected between the output terminal 3 and the power supply $V_{cc}$, i.e., the output voltage $V_O$ is given by equation (25).

$$V_O = I_O \cdot R_L \qquad (25)$$

From equations (23), (24) and (25), equation (26) is obtained.

$$V_O = \alpha \cdot I_{BO} \cdot R_L + (C - \alpha \cdot I_{AO}) \cdot (R_1) / R_2 \cdot (V_B) / V_A \qquad (26)$$

where the first term of the equation (26) is constant and the second term shows a signal representing the $V_B/V_A$ component. In other words, a division output voltage $V_O$ is produced at the terminal 3 from the divisor signal voltage $V_A$ applied to terminal 1 and the divided signal voltage $V_B$ applied to the terminal 2.

Figure 6:
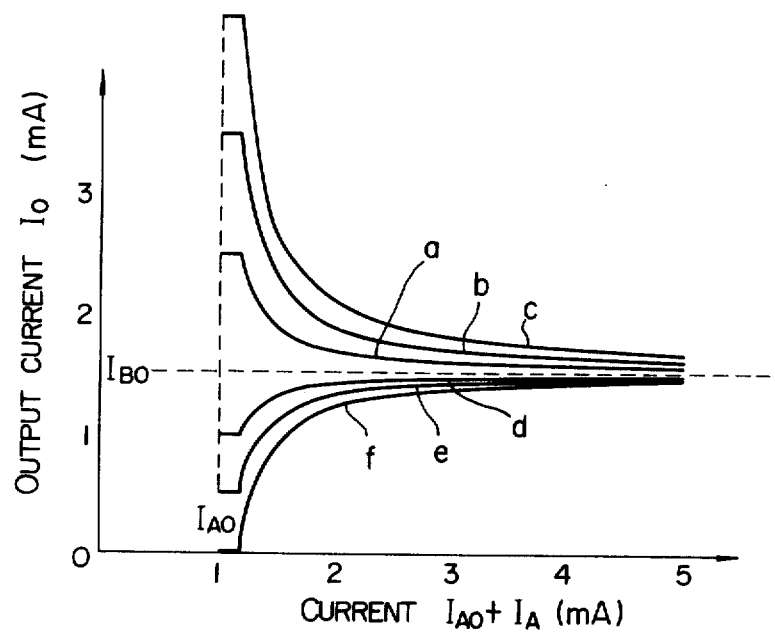
FIG. 6 is a characteristics diagram showing the current of the input signal A and the current of the output signal with the current of input signal B as a parameter in the second embodiment.

With reference to the second embodiment of FIG. 5a, the characteristics of the circuit thereof are shown in FIG. 6, where $V_{cc}=12$ V, $V_2=6$ V, $R_A=5$ KΩ, $R_1=500$ Ω, $R_2=500$ Ω, $I_{AO}=1$ mA and $I_{BO}=1.5$ mA, for example. In this figure, the abscissa represents the current ($I_{AO}+I_A$) in mA, and the ordinate the output current $I_O$ in mA. Reference characters a, b and c show curves of positive currents $I_B$ of 1 mA, 2 mA and 3 mA respectively. The curves are parts of hyperbolas having asymptotes of two dotted straight lines represented by the currents $I_O = I_{BO}$ and $I_{AO}=(I_{AO}+I_A)$. It is seen that the current ($I_O-I_{BO}$) is accurately proportional to $1/I_A$.

Next, assume that the current $I_A$ is fixed at, say, 1 mA. The relation between the current ($I_O-I_{BO}$) and $I_B$ is such that the current ($I_O-I_{BO}$) is also proportional to the current $I_B$, and therefore the current ($I_O-I_{BO}$) is proportional to $I_B/I_A$. At the current $I_A$ of 0.2 mA or lower, the current $I_O$ does not increase but is maintained constant regardless of decrease in the current $I_A$. This is because with the decrease in the current $I_A$, the condition mentioned above, i.e., $I_A \geq C - \alpha \cdot I_{AO}$ fails to be satisfied. Next, curves d, e and f are associated with the negative currents $I_B$ of $-0.5$ mA, $-1$ mA and $-1.5$ mA respectively. It is also noted from this that the current ($I_O-I_{BO}$) is proportional to $I_B/I_A$. In the case where $I_B$ is smaller than zero, however, the absolute value $|I_B|$ of the current $I_B$ cannot exceed the current $I_B$, the upper limit thereof being 1.5 mA in this example.

As explained above, in the second embodiment of the present invention shown in FIG. 5a, it is possible to produce a current proportional to $I_B/I_A$ at the output terminal 3, on the condition that $$I_A \geq \frac{V_{cc} - V_2}{R_A} - \alpha \cdot I_{AO} > 0$$

and also $I_B \geq -I_{BO}$.

Figure 5B:
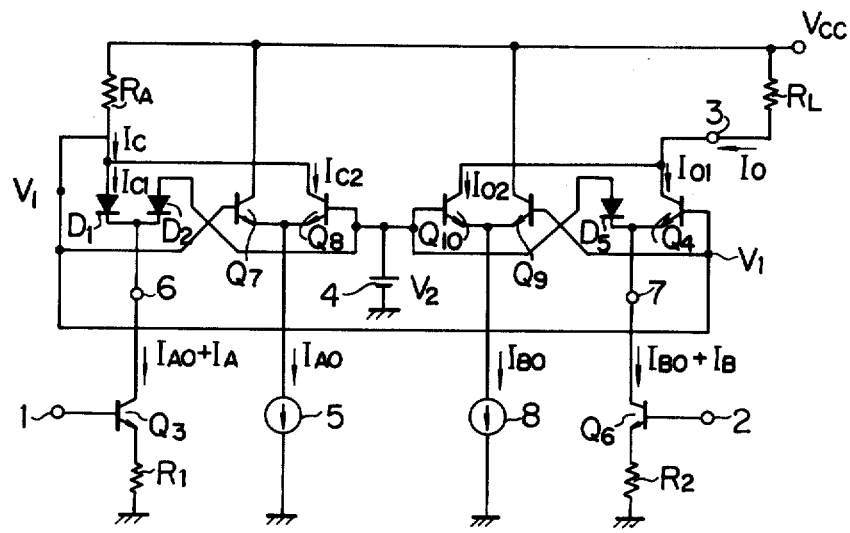
FIG. 5b is a circuit diagram showing a modification of the second embodiment of the present invention.

In a special case, the currents $I_{AO}$ and/or $I_{BO}$ may take zero in value at the same time. In that case, the first DC bias offsetting circuit made up of the transistors $Q_7$ and $Q_8$ or the second DC bias offsetting circuit made up of the transistors $Q_9$ and $Q_{10}$ may be eliminated. In the embodiment of FIG. 5 where the base of the transistor $Q_1$ is connected to the collector thereof, the configuration may be replaced equivalently by a diode having an anode in place of the base and collector, and a cathode in place of the emitter. Thus, the transistor $Q_1$ may be replaced by a diode with equal effect. In similar fashion, the collectors of the transistors $Q_2$ and $Q_5$ may be connected to the fixed power supply 4 instead of to the power supply $V_{cc}$. In this case, the transistors $Q_2$ and $Q_5$ with the collector and base thereof connected to each other may be considered as diodes respectively. The circuit where the transistors $Q_1$, $Q_2$ and $Q_5$ are replaced by the diodes $D_1$, $D_2$ and $D_5$ respectively is shown in FIG. 5b. Also, instead of connecting the collector and base of the transistor $Q_1$ directly, a resistor or a diode may be inserted between the collector and base of the transistor $Q_1$. In short, it suffices if a feedback circuit is provided from the collector to base of the transistor $Q_1$. It is also possible to provide a feedback path of a properly designed amplifier between the collector and base of the transistor $Q_1$.

The second embodiment of FIG. 5a shows the case in which the current $I_A$ takes a positive value. On the other hand, another embodiment in which the current $I_A$ is negative will be explained with reference to FIG. 7. In this drawing, like reference numerals denote like component elements as in the second embodiment of FIG. 5a. The circuit configuration of this third embodiment is almost the same as in the second embodiment, the only difference being mentioned below. In the first variable gain circuit, the base of the transistor $Q_1$ is connected to the fixed voltage source 4 and fixed at a constant voltage $V_2$; the base of the transistor $Q_2$ is connected to the collector of the transistor $Q_1$; the base of the transistor $Q_4$ in the second variable gain circuit is connected to the base of the transistor $Q_1$ and fixed at the constant voltage $V_2$ equal to the base voltage of the transistor $Q_1$; and the base of the transistor $Q_5$ is connected to the base of the transistor $Q_2$ and impressed with the same voltage $V_1$ as the base voltage of the transistor $Q_2$.

In this circuit, assume that the collector current of the transistor $Q_3$ is ($I_{AO}-|I_A|$), where the current $I_{AO}$ is a DC bias current as in the second embodiment. The absolute value of the current $I_A$, i.e., $-|I_A|$ is a signal current component which is expressed negatively for facilitating the understanding since the current $I_A$ is negative. The current $|I_A|$ is of course smaller than the current $I_{AO}$. Since the base voltage of the transistors $Q_1$ and $Q_7$ is $V_2$, and the base voltage of the transistors $Q_2$ and $Q_8$ is $V_1$, the currents $I_{C1}$ and $I_{C2}$ are expressed by equations (27) and (28) respectively.

$$I_{C1} = \frac{\alpha}{1 + e^{\frac{-q(V_2-V_1)}{kT}}} \cdot (I_{AO} - |I_A|) \qquad (27)$$

$$I_{C2} = \frac{\alpha}{1 + e^{\frac{q(V_2-V_1)}{kT}}} \cdot I_{AO} \qquad (28)$$

Therefore, the sum $I_C$ of the currents $I_{C1}$ and $I_{C2}$ is given by equation (29).

$$I_C = \alpha \cdot I_{AO} - \frac{\alpha}{1 + \epsilon^{\frac{-q(V_2-V_1)}{kT}}} \cdot |I_A| \qquad (29)$$

$$= \alpha \cdot I_{AO} - (1-K) \cdot |I_A|$$

where K is the gain defined in equation (2) above. Thus, given $I_C = C$, $$(1-K) \cdot |I_A| = \alpha \cdot I_{AO} - C \qquad (29')$$

In the circuit of FIG. 7, if the current $|I_A|$ increases, the current $I_C$ tends to decrease. With the decrease in the current $I_C$, the voltage drop across the resistor $R_A$ decreases so that the voltage $V_1$, i.e., the base voltage of the transistor $Q_2$ increases. As a result, the gain K is increased according to the characteristics of FIG. 2, and the value $(1-K)$ in equation (29) is reduced, thus dampening the reduction in current $I_C$. In the case where the value of current $|I_A|$ decreases, by contrast, a slight drop in the voltage $V_1$ dampens the increase in the current $I_C$. In other words, the voltage $V_1$ changes automatically in such a manner as to maintain the current $I_C$ constant as in the first and second embodiments. The constant value C of the current $I_C$ is given by equation (4) as in the first and second embodiments. Also, the equation (18) representing the condition of the resistor $R_A$ is rewritten as equation (30).

$$R_A \geq (V_{cc} - V_2)/(\alpha \cdot I_{AO} - |I_A| \text{ min.}) \qquad (30)$$

Since the base voltage of the transistors $Q_4$ and $Q_9$ is $V_2$, and the base voltage of the transistors $Q_5$ and $Q_{10}$ is $V_1$, the collector currents $I_{01}$ and $I_{02}$ of the transistors $Q_4$ and $Q_{10}$ are given by the equations (31) and (32).

$$I_{01} = \frac{\alpha}{1 + \epsilon^{\frac{-q(V_2-V_1)}{kT}}} \cdot (I_{BO} + I_B) \qquad (31)$$

$$I_{02} = \frac{\alpha}{1 + \epsilon^{\frac{q(V_2-V_1)}{kT}}} \cdot I_{BO} \qquad (32)$$

Thus the current $I_O$ flowing at the output terminal 3 is as shown in equation (33).

$$I_O = \alpha \cdot I_{BO} + (1-K) \cdot I_B \qquad (33)$$

From equation (29'), $(1-K) = (\alpha \cdot I_{AO} - C)/|I_A|$, which is substituted into equation (33), giving equation (34) below.

$$I_O = \alpha \cdot I_{BO} + (\alpha \cdot I_{AO} - C) \cdot (I_B)/|I_A| \qquad (34)$$

The current $I_O$ expressed by the equation (34) gives the result of division $I_B/|I_A|$ as in the second embodiment.

Figure 7A:
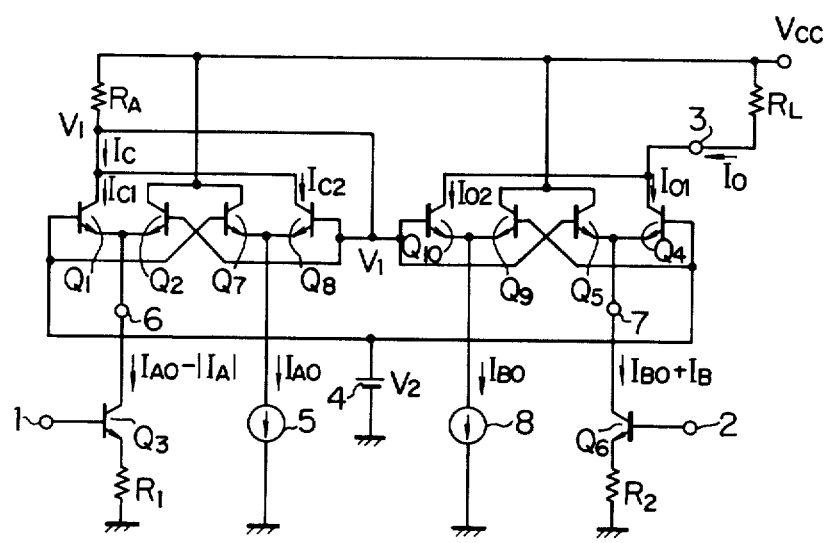
FIG. 7a is a circuit diagram showing a third embodiment of the present invention.
Figure 8:
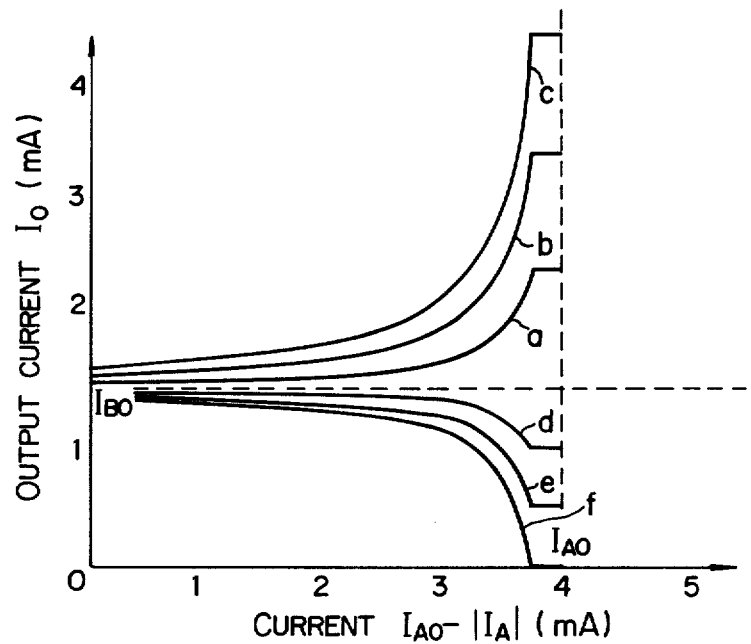
FIG. 8 is a characteristics diagram showing the current of input signal A and the current of output signal with the current of input signal B as a parameter in the third embodiment.

As an example, assume that the constants in the third embodiment shown in FIG. 7a are $V_{cc} = 12$ V, $V_2 = 6$ V, $R_A = 1.6$ KΩ, $R_1 = 500$ Ω, $R_2 = 500$ Ω, $I_{AO} = 4$ mA and $I_{BO} = 1.5$ mA. Then the characteristics of this circuit are as shown in FIG. 8. In this drawing, the abscissa represents the current $(I_{AO} - |I_A|)$ in mA and the ordinate the output current $I_O$ in mA. Curves a, b and c are associated with positive values 1 mA, 2 mA and 3 mA respectively of the current $I_B$, and the curves d, e and f associated with the negative values −0.5 mA, −1 mA and −1.5 mA respectively thereof. Each curve is part of a hyperbola with two straight dotted lines $I_O = I_{BO}$ and $(I_{AO} - |I_A|) = I_{AO}$ as an asymptote. It is seen that as in the second embodiment, a current proportional to $I_B/I_A$ is produced at the output terminal 3, only subject to the following conditions:

$$I_A < 0$$

$$\alpha \cdot I_{AO} - (V_{cc} - V_2)/R_A \leq |I_A| \leq I_{AO}$$

$$I_B \geq -I_{BO}$$

Suppose the transistor symbols in the third embodiment shown in FIG. 7a are replaced as follows: $Q_1$ by $q_8$, $Q_2$ by $q_7$, $Q_4$ by $q_{10}$, $Q_5$ by $q_9$, $Q_7$ by $q_2$, $Q_8$ by $q_1$, $Q_9$ by $q_5$ and $Q_{10}$ by $q_4$. When comparing the circuit of FIG. 7a with the circuit of FIG. 5a with the new symbols, it will be noted that the circuit of FIG. 7a is equivalent to a circuit in which the transistor $Q_3$ is replaced by the constant current source 5 and the transistor $Q_5$ by the constant current source 8 in the circuit FIG. 5a. In other words, the third embodiment is equivalent to a circuit in which the signal currents are replaced by constant currents in the second embodiment.

Figure 7B:
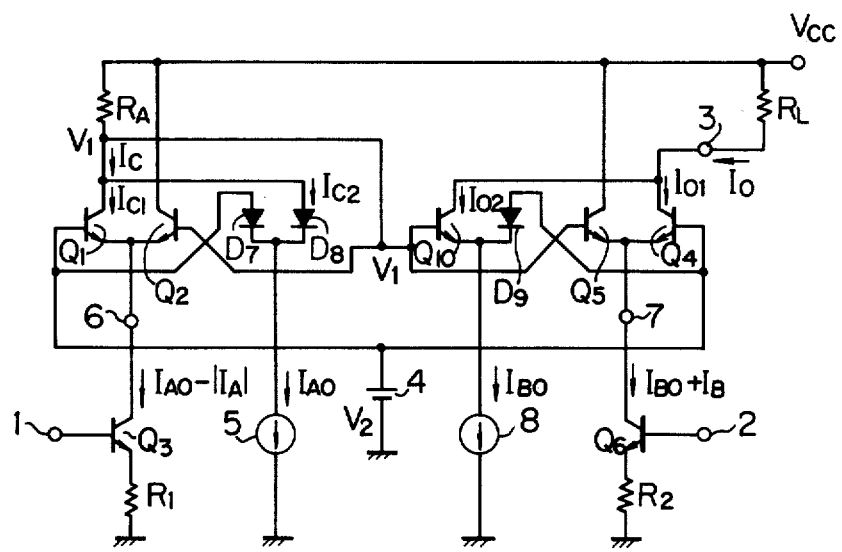
FIG. 7b is a circuit diagram showing a modification of the third embodiment of the present invention.

In a special case of the third embodiment, the current $I_{BO}$ may take zero, in which case the second DC bias offsetting circuit including the transistors $Q_9$ and $Q_{10}$ may be eliminated. Also, in the third embodiment in which the collector and base of the transistor $Q_8$ are connected with each other, it is considered equivalent to a diode in which an anode comprises the base and collector, and a cathode comprises the emitter. Thus the transistor $Q_8$ may be replaced by a diode virtually with equal effect. In similar fashion, the transistors $Q_7$ and $Q_9$ may be replaced by diodes respectively. The diagram of FIG. 7b shows a circuit in which the transistors $Q_7$, $Q_8$ and $Q_9$ are replaced by diodes $D_7$, $D_8$ and $D_9$ respectively. Further, instead of connecting the collector of the transistor $Q_1$ directly to the base of the transistor $Q_2$, they need not be directly connected but it is only required that as in the first embodiment, a feedback path be provided from the collector of the transistor $Q_1$ to the base of the transistor $Q_2$.

The fourth embodiment of the present invention will be explained with reference to FIG. 9. This embodiment includes a differential amplifier in the negative feedback path from the collector to the base of the transistor $Q_1$ in the second embodiment. The circuit part made up of the transistors $Q_{41}$ and $Q_{42}$ and resistors $R_3$, $R_4$ and $R_5$ is the differential amplifier making up the feedback path. The circuit of FIG. 9 corresponds to that of the second embodiment, in which the current $I_A$ is positive and whose operation is similar to that of the second embodiment. In this fourth embodiment, however, the base voltage of the transistor $Q_2$ is not fixed unlike in the second embodiment, but the feedback voltage is applied to the bases of both the transistors $Q_1$ and $Q_2$. As an alternative, of course, one of the base voltages may be fixed for effective operation.

In this circuit, with the increase in the collector current $I_C$ of the transistor $Q_1$, the base current, emitter current and the collector current of the transistor $Q_{41}$ are also increased. As a result, the emitter current and the collector current of the transistor $Q_{42}$ are reduced, followed by reduction in the base voltage of the transistor $Q_1$, thus preventing the collector current $I_C$ of the transistor $Q_1$ from being increased. Also, in this case, the collector voltage of the transistor $Q_{41}$ is supplied to the base of the transistor $Q_2$ with an increased emitter current of the transistor $Q_2$, and therefore the collector current of the transistor $Q_1$ is also prevented from increasing. As a consequence, the collector current $I_C$ of the transistor $Q_1$ is maintained constant at the value C. Operation is similar also in the case in which the collector current $I_C$ decreases.

Figure 9:
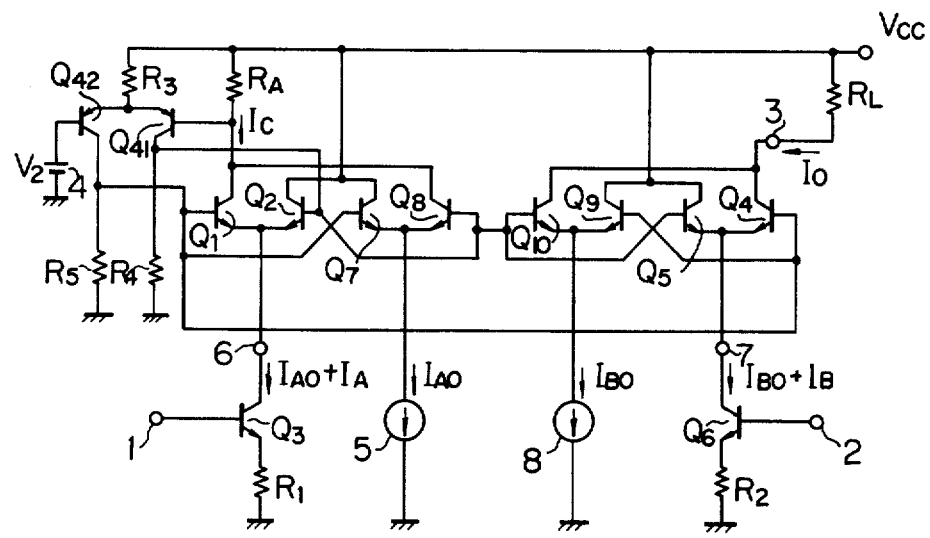
FIG. 9 is a circuit diagram showing a fourth embodiment of the present invention.

When the current $I_A$ is negative in the circuit of FIG. 9, the wirings of the collector or base of the transistors $Q_{41}$ and $Q_{42}$ are replaced with each other, in which case it corresponds to the third embodiment above.

In the second, third and fourth embodiments, the resistor $R_A$ is connected between the collector of the transistor $Q_1$ and the power supply $V_{cc}$, which need not necessarily be a resistor. Instead, it may be current source load of an active element often used in semiconductor integrated circuits.

As explained above, according to the second, third and fourth embodiments, the dividing operation of signals A and B can be performed with a high accuracy with a circuit simpler than any conventional circuits. Especially, even in the case where the signal A or B contains a component like a DC bias which cannot be considered as a signal component, it is possible to perform the dividing operation of only the signal components. It will be noted that these embodiments are very valuable in view of the fact that the B/A component cannot be mathematically easily separated from $(B_O+B)/(A_O+A)$. Also, in these embodiments, the signal B may take an either positive or negative value in the calculation of B/A. In terms of electrical signals, it means that the signal B may take the form of a signal not containing any DC portion such as a high frequency band component of a video signal or an audio signal. Also in the calculation of B/A, appropriate design is possible regardless of whether the sign of the signal A, i.e., the polarity of the electrical signal is positive or negative. Further, if the signal B is maintained constant (direct current), the current $I_B$ is fixed, thus making it possible to calculate the reciprocal substantially represented by 1/A.

Next, fifth to eighth embodiments of the present invention will be explained. According to these embodiments, the dividing operation of the signal components alone is possible in the case where the signals A and B contain a component such as a DC bias and also in the case where the signal component takes an either positive or negative value. This divider circuit uses a double-balanced circuit with differential amplifiers combined as a variable gain circuit.

Figure 10:
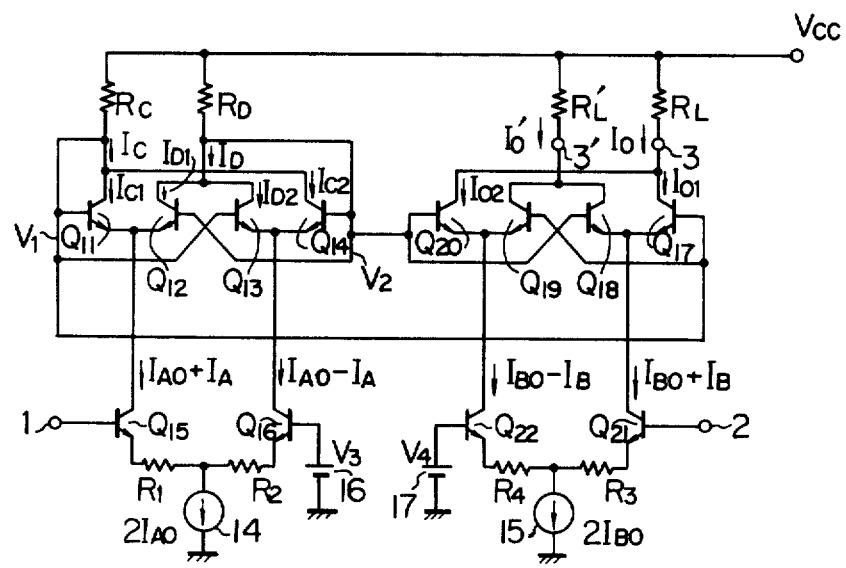
FIG. 10 is a circuit diagram showing a fifth embodiment of the present invention.

The circuit diagram of FIG. 10 is for explaining the fifth embodiment of the present invention. In this drawing, the transistors $Q_{15}$ and $Q_{16}$ make up a first differential amplifier. The base of the transistor $Q_{15}$ is connected to the input terminal 1 of the signal A, and the base of the transistor $Q_{16}$ is connected to the fixed voltage source 16 and impressed with the voltage $V_3$. The constant current source 14 is connected via the resistors $R_1$ and $R_2$ to the differential amplifier, and the current $2I_{AO}$ flows in the constant current source 14. The current flowing in the collectors of the transistors $Q_{15}$ and $Q_{16}$ is the sum of or difference between the current $I_{AO}$ and the signal current $I_A$ based on the signal A applied to the input terminal 1, which takes the form of $(I_{AO}+I_A)$ or $(I_{AO}-I_A)$ respectively.

The transistors $Q_{11}$ and $Q_{12}$ make up a first variable gain circuit, and the transistors $Q_{13}$ and $Q_{14}$ a third variable gain circuit. The emitters of the transistors $Q_{11}$ and $Q_{12}$ are connected to each other and so are the emitters of the transistors $Q_{13}$ and $Q_{14}$, which are in turn connected to the collectors of the transistors $Q_{15}$ and $Q_{16}$ of the first differential amplifier respectively. The bases of the transistors $Q_{11}$ and $Q_{13}$ are connected to each other, and so are the bases of the transistors $Q_{12}$ and $Q_{14}$. The collectors of the transistors $Q_{11}$ and $Q_{14}$ are connected to each other, and so are the collectors of the transistors $Q_{12}$ and $Q_{13}$, which are further connected through the resistor $R_C$ and $R_D$ to the power supply $V_{cc}$. The collectors of the transistors $Q_{11}$ and $Q_{12}$ are connected to the bases thereof respectively.

In the above-described first differential amplifier and the first and third variable gain circuit, it is assumed that the collector currents $I_{C1}$, $I_{D1}$, $I_{D2}$ and $I_{C2}$ flow in the transistors $Q_{11}$ to $Q_{14}$ respectively, the sum of the collector currents of transistors $Q_{11}$ to $Q_{14}$ is $I_C$, and that the sum of the collector currents of the transistors $Q_{12}$ and $Q_{13}$ is $I_D$. The collector currents of the transistors $Q_{15}$ and $Q_{16}$ are $(I_{AO}+I_A)$ and $(I_{AO}-I_A)$ respectively. Also, let $V_1$ be the base voltage of the transistors $Q_{11}$ and $Q_{13}$, and $V_2$ be the base voltage of the transistors $Q_{12}$ to $Q_{14}$. Then the currents $I_{C1}$, $I_{C2}$, $I_{D1}$ and $I_{D2}$ are expressed by equations (35) to (38) as well known.

$$I_{C1} = \frac{\alpha}{1 + \epsilon^{\frac{q(V_2-V_1)}{kT}}} \cdot (I_{AO} + I_A) \quad (35)$$

$$I_{C2} = \frac{\alpha}{1 + \epsilon^{\frac{-q(V_2-V_1)}{kT}}} \cdot (I_{AO} - I_A) \quad (36)$$

$$I_{D1} = \frac{\alpha}{1 + \epsilon^{\frac{-q(V_2-V_1)}{kT}}} \cdot (I_{AO} + I_A) \quad (37)$$

$$I_{D2} = \frac{\alpha}{1 + \epsilon^{\frac{q(V_2-V_1)}{kT}}} \cdot (I_{AO} - I_A) \quad (38)$$

In these equations, the current amplification factor $\alpha$ is very near to 1, and therefore the value of $\alpha$ is assumed to be 1 to facilitate the understanding of the explanation that follows. Next, if the formula $1/(1+\epsilon^x)+1/(1+\epsilon^{-x})=1$ is used to obtain the currents $I_C$ and $I_D$ from the equations (36) and (38), then equations (39) and (40) are derived.

$$I_C = I_{C1} + I_{C2} = I_{AO} + \left( \frac{2}{1 + \epsilon^{\frac{q(V_2-V_1)}{kT}}} - 1 \right) \cdot I_A \quad (39)$$

$$I_D = I_{D1} + I_{D2} = I_{AO} - \left( \frac{2}{1 + \epsilon^{\frac{q(V_2-V_1)}{kT}}} \right) \cdot I_A \quad (40)$$

If P is defined to be $$P = \frac{2}{1 + \epsilon^{\frac{q(V_2-V_1)}{kT}}} - 1 \quad (41)$$

then, the equations (39) and (40) are rewritten as equations (42) and (43)

$$I_C = I_{AO} + P \cdot I_A \quad (42)$$

$$I_D = I_{AO} - P \cdot I_A \tag{43}$$

Figure 11:
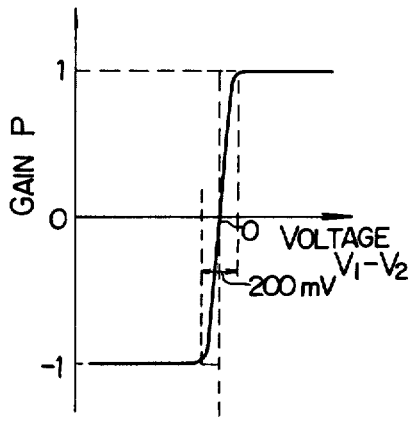
FIG. 11 is a characteristics diagram showing the relation between the gain P and the voltage $V_1-V_2$.

The relation between the gain P shown in equation (41) and the voltage $(V_1-V_2)$ is shown in FIG. 11. In this drawing, the abscissa represents the voltage $(V_1-V_2)$ and the ordinate the gain P. It should be noted that the gain P changes so sharply with the voltage $(V_1-V_2)$ that the gain P changes from $-1$ to $+1$ with change of the voltage $(V_1-V_2)$ by only $\pm 100$ mV from zero. Taking into consideration the fact that the value of current $I_{AO}$ is constant in equations (42) and (43), it means that it is possible to maintain the currents $I_C$ and $I_D$ constant by changing the voltage $(V_1-V_2)$ slightly even if the current $I_A$ changes. Since $-1 \leq P \leq 1$ of course, the range of change in the current $I_A$ to enable the current $I_C$ or $I_D$ to be maintained constant is naturally limited.

In the fifth embodiment of the present invention, the collectors of the transistors $Q_{11}$ and $Q_{14}$ are connected to the bases of the transistors $Q_{11}$ and $Q_{13}$ respectively; and the collectors of the transistors $Q_{12}$ $Q_{13}$ are connected to the bases of the transistors $Q_{12}$ and $Q_{14}$ respectively. Now, assume that the current $I_A$ increases in the range larger than zero. P is larger than zero, and with the increase in the current $I_A$, the current $I_C$ increases while the current $I_D$ decreases. With the increase in the current $I_C$, however, the voltage $V_1$ decreases. With the decrease in the current $I_D$, the voltage $V_2$ increases. As a result, the voltage $(V_1-V_2)$ decreases, thus reducing the value of gain P. Thus both the increase in current $I_C$ and the decrease in current $I_D$ are dampened. Assuming, on the other hand, that $(V_1-V_2)$ is smaller than zero initially, P is smaller than zero, and with the increase in current $I_A$, the current $I_C$ decreases and the current $I_C$ increases. With the decrease in current $I_C$, however, the voltage $V_1$ increases; and with the increase in the current $I_D$, the voltage $V_2$ decreases, so that the voltage $(V_1-V_2)$ increases, thus increasing the gain P. (The absolute value $|P|$ decreases since P is smaller than zero) The reduction in the current $I_C$ and the increase in the current $I_D$ are thus dampened similarly. The changes in currents $I_C$ and $I_D$ are also damped in the case where the current $I_A$ is reduced in the positive range.

When $I_A$ is smaller than zero, by the way, the changes in the currents $I_C$ and $I_D$ are increased instead of dampened. To overcome this situation, the wirings of the collectors of the transistors $Q_{15}$ and $Q_{16}$ are interchanged with each other, about which explanation will be made in detail with reference to the sixth embodiment.

In any way, in the range of $I_A$ larger than zero, the voltage $(V_1-V_2)$ automatically changes within $\pm 100$ mV in a manner to maintain the current $I_D$ constant. And the voltages $V_1$ and $V_2$ are equal to the collector voltages of the transistors $Q_{11}$, $Q_{14}$; $Q_{12}$, $Q_{13}$, respectively, the difference therebetween being at most 100 mV. Thus the voltage drop across the resistor $R_C$ substantially equal to that across the resistor $R_D$. If the voltage $(V_1-V_2)$ is neglected, equation (44) is established.

$$R_C I_C = R_D I_D \tag{44}$$

Since equation (45) is obtained from equations (42) and (43), $$I_C + I_D = 2I_{AO} \tag{45}$$

the currents $I_C$ and $I_D$ are expressed by equations (46) and (47) from equations (44) and (45).

$$I_C = R_D/(R_C+R_D) \cdot 2I_{AO} \tag{46}$$

$$I_D = R_C/(R_C+R_D) \cdot 2I_{AO} \tag{47}$$

Further, from equation (43), $$P \cdot I_A = \frac{R_D - R_C}{R_C + R_D} \cdot I_{AO} = C \tag{48}$$

It should be noted here that if $R_D = R_C$ exactly, $P=0$, which fails to meet the requirements of the present invention. Therefore, the system of the present invention must be designed so that the values of the resistors $R_D$ and $R_C$ are different without fail. The value $(R_D - R_C)$ may be determined appropriately taking into consideration the accuracy of the dividing operation or the like. If this value is large, the value C also becomes large, with the result that the sensitivity of the dividing operation or the gain increases, while enlarging the inoperative range.

Next, the operation including the transistors $Q_{17}$ to $Q_{22}$ will be explained. The transistors $Q_{21}$ and $Q_{22}$ make up a second differential amplifier. The base of the transistor $Q_{21}$ is connected to the input terminal 2 of the signal B, and the base of the transistor $Q_{22}$ is connected to the constant voltage source 17 and impressed with the voltage $V_4$. The constant current source 15 is connected to the differential amplifier through the resistors $R_4$ and $R_5$, and the current $2I_{BO}$ flows in the constant current source 15.

The collector currents of the transistors $Q_{21}$ and $Q_{22}$ take the form of $(I_{BO}+I_B)$ and $(I_{BO}-I_B)$ respectively. The transistors $Q_{17}$ to $Q_{20}$ make up the second and fourth variable gain circuits and are connected as mentioned below as in the first and third variable gain circuits. The emitters of the transistors $Q_{17}$ and $Q_{18}$ are connected to each other, and so are the emitters of the transistors $Q_{19}$ and $Q_{20}$. All of the emitters are connected further to the collectors of the transistors $Q_{21}$ and $Q_{22}$ of the second differential amplifier. The bases of the transistors $Q_{17}$ and $Q_{19}$ are connected to each other on the one hand and further to the bases of the transistors $Q_{11}$ and $Q_{13}$ of the first and third variable gain circuits on the other hand. In similar manner, the bases of the transistors $Q_{18}$ and $Q_{20}$ are connected to each other and to the bases of the transistors $Q_{12}$ and $Q_{14}$ at the same time. The collectors of the transistors $Q_{17}$ and $Q_{20}$ are connected to each other, and so are the collectors of the transistors $Q_{18}$ and $Q_{19}$, which are further connected to the output terminals 3 and 3' respectively. Load resistors $R_L$ and $R_L'$ are inserted between the output terminals 3 and 3' and the power supply $V_{cc}$ respectively. In the above-mentioned second differential amplifier and the second and fourth variable gain circuits, the collector currents of the transistors $Q_{17}$ and $Q_{20}$ are given by $I_{O1}$ and $I_{O2}$, and the current flowing in the output terminal 3 by $I_O$. The collector currents of the transistors $Q_{21}$ and $Q_{22}$ are $(I_{BO}+I_B)$ and $(I_{BO}-I_B)$ respectively as mentioned earlier. Since the base voltage of the transistors $Q_{17}$ and $Q_{19}$ is $V_1$, and the base voltage of the transistors $Q_{18}$ and $Q_{20}$ are $V_2$, the currents $I_{O1}$, $I_{O2}$ and $I_O$ are expressed by equations below as well known.

$$I_{01} = \frac{\alpha}{1 + \epsilon^{\frac{q(V_2 - V_1)}{kT}}} \cdot (I_{BO} + I_B) \quad (49)$$

$$I_{02} = \frac{\alpha}{1 + \epsilon^{\frac{-q(V_2 - V_1)}{kT}}} \cdot (I_{BO} - I_B) \quad (50)$$

$$I_O = I_{01} + I_{02} = I_{BO} + \left( \frac{2}{1 + \epsilon^{\frac{q(V_2 - V_1)}{kT}}} - 1 \right) \cdot I_B \quad (51)$$

$$= I_{BO} + P \cdot I_B$$

The gain P is obtained from equation (48) and substituted into equation (51), and then equation (52) is derived.

$$I_O = I_{BO} + \frac{R_D - R_C}{R_C + R_D} \cdot I_{AO} \cdot \frac{I_B}{I_A} \quad (52)$$

Since $(R_D - R_C)/(R_C + R_D) \cdot I_{AO}$ is constant, this is replaced as C.
Then equation (52) is rewritten into $$I_O = I_{BO} + C \cdot (I_B / I_A) \quad (53)$$

Equation (53) means that a current proportional to $I_B/I_A$ is produced at the output terminal 3. In similar fashion, let $I_O'$ be the current flowing at the other output terminal 3', then equation (54) is given.

$$I_O' = I_{BO} - C \cdot (I_B / I_A) \quad (54)$$

Figure 12:
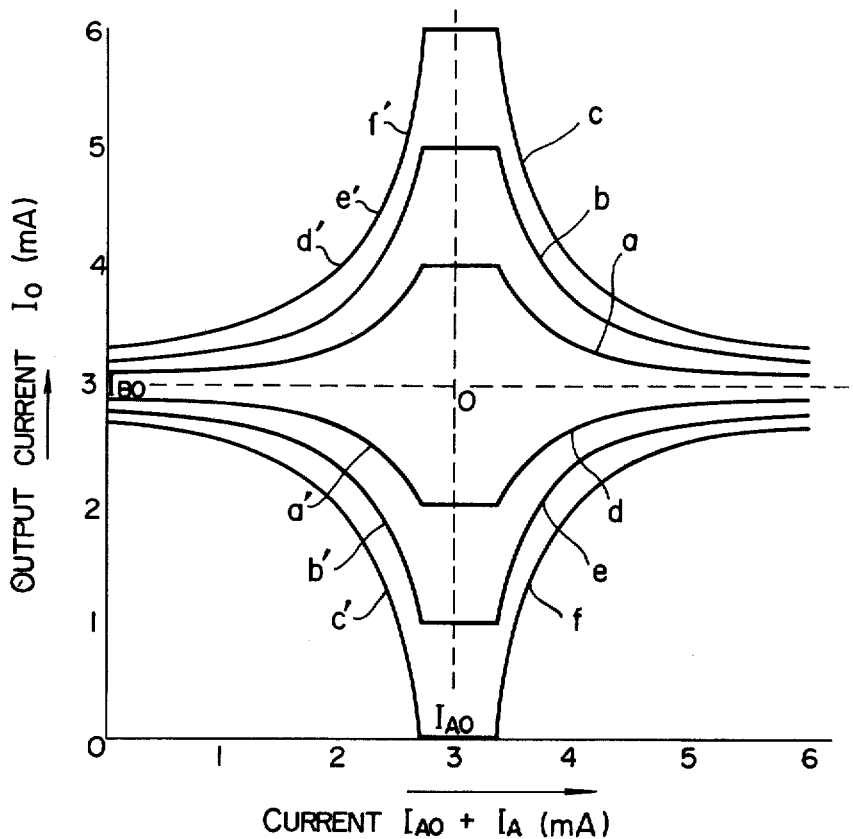
FIG. 12 is a characteristics diagram showing the current of input signal A and the current of output signal with the current of input signal B as a parameter in the fifth and sixth embodiments.

This is indicative of the fact that a current proportional to $I_B/I_A$ but of reverse polarity is produced. Further, if the current difference between the terminals 3 and 3' is taken out or the voltage between the output terminals is taken out on condition that $R_L = R_L'$, then the component of current $I_{BO}$ is cancelled so that only $I_B/I_A$ is obtained. The characteristics of a design example of the divider circuit are shown in FIG. 12, where it is assumed that $R_C = 1.6K\Omega$, $R_D = 2K\Omega$, $I_{AO} = 3$ mA and $I_{BO} = 3$ mA. In this graph, the abscissa represents the current $(I_{AO} + I_A)$ and the ordinate the current $I_O$. The understanding is facilitated, however, if the origin is relocated to a point where the current I stands at $I_{AO}$ on the abscissa and the current stands at $I_O$ on the ordinate. In the graph, reference characters a, b, c, d, e and f denote the cases where $I_A$ is larger than zero and where the current $I_B$ is 1 mA, 2 mA, 3 mA, −1 mA, −2 mA and −3 mA respectively. It is noted that each curve forms part of a hyperbola, and the current $I_O$ is proportional to $1/I_A$ and the current $I_B$. At the current $I_A$ below 0.33 mA, the current $I_O$ remains unchanged because the value of gain P in equation (48) and the like is limited to lower than 1. The lower limit of the current $I_A$ is designable as desired by appropriately selecting the values of the current $I_{AO}$ and the resistors $R_C$ and $R_D$, but they cannot be zero. The explanation of the present invention in the case where $I_A$ is larger than zero is now over.

Figure 13:
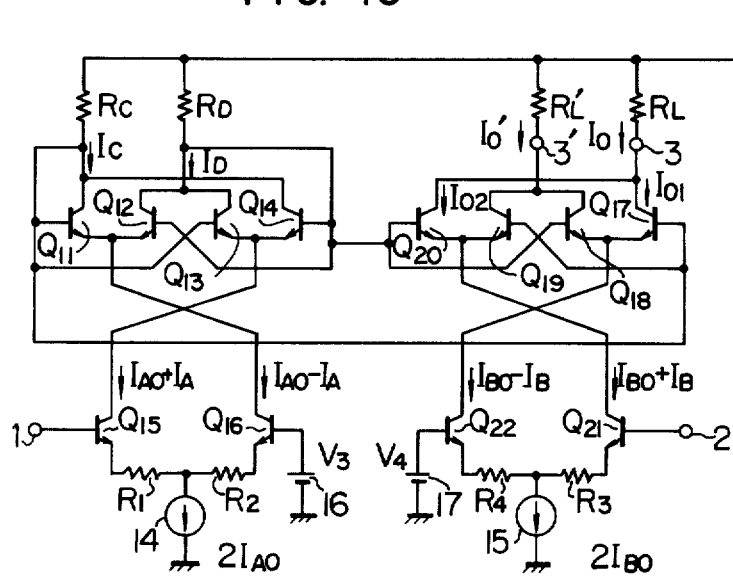
FIG. 13 is a circuit diagram showing a sixth embodiment of the present invention.

Now, explanation will be made of the case where $I_A$ is smaller than zero. As briefly explained above, the circuit configuration of FIG. 10 fails to operate successfully, and the circuit configuration as shown in the sixth embodiment of FIG. 13 is required. In FIG. 13, like reference numerals denote like component elements as in FIG. 10. This sixth embodiment is different from the fifth embodiment in that the wirings of the transistors $Q_{15}$ and $Q_{16}$ and transistors $Q_{21}$ and $Q_{22}$ are interchanged with each other respectively. The collector currents $I_4$ of the transistors $Q_{15}$ and $Q_{16}$ are of opposite polarities, and in view of the fact that $I_A$ is smaller than zero and the collectors have been interchanged, the emitter currents of the transistors $Q_{11}$ and $Q_{12}$, $Q_{13}$ and $Q_{14}$ are $(I_{AO} + |I_A|)$ and $(I_{AO} - |I_A|)$ respectively, which are of the same polarity as in the case where $I_A$ is larger than zero in the fifth embodiment. Therefore, the currents $I_C$ and $I_D$ remain the same regardless of changes in the current $I_A$ in quite the same manner as in the fifth embodiment. In this case, $P \cdot |I_A|$ corresponds to equation (48). Since $I_A$ is smaller than zero, $|I_A| = -I_A$, and therefore equation (48) is expressed as $$P \cdot I_A = -C \quad (48')$$

In this case, the collector wirings of the transistors $Q_{21}$ and $Q_{22}$ are interchanged with each other, and therefore the current $I_O$ is given as $$I_O = I_{BO} - P \cdot I_B \quad (51')$$

From equations (48') and (51'), the current $I_O$ is obtained in the form of equation (53) in quite the same manner as in the fifth embodiment. This is also the case with the current $I_O'$ which is expressed by equation (54). In other words, exactly the same dividing operation is performed when $I_A$ is smaller according to the sixth embodiment as when $I_A$ is larger than zero according to the fifth embodiment. The characteristics of the sixth embodiment of a design with the same circuit constants as in the fifth embodiment are shown by curves a' to f' of FIG. 12. The current $I_B$ of the reference characters a' to f' correspond to the current $I_B$ of the curves a to f in the fifth embodiment, while the curves a' to f' are symmetric with the curves a to f with respect to point 0'.

Figure 14:
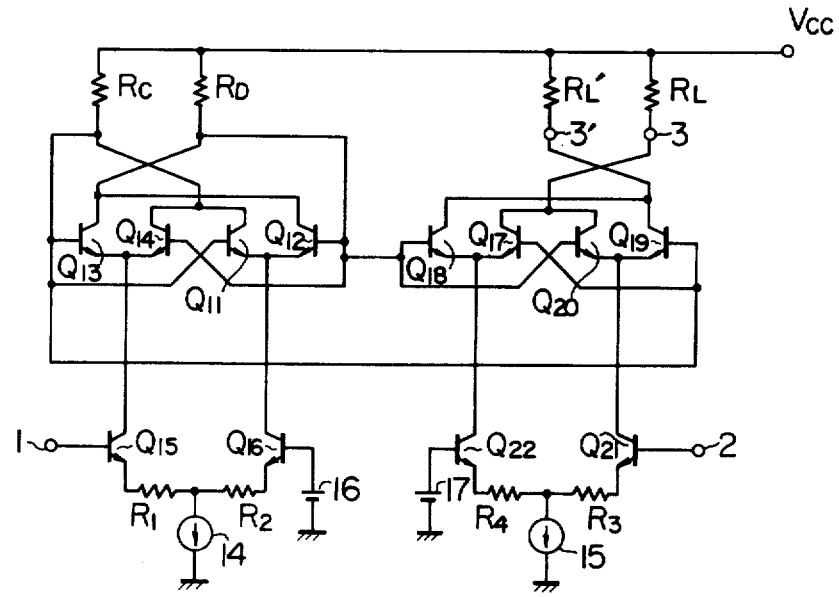
FIGS. 14 and 15 are circuit diagrams showing modifications of the sixth embodiment.

By changing the arrangement of transistors, the circuit diagram of FIG. 13 may be rewritten into the circuit diagram as shown in FIG. 14. The circuits of FIGS. 13 and 14, while written in different ways, are quite the same. If the fifth embodiment of FIG. 10 is considered a basic circuit, the circuit of FIG. 13 is such that the collectors of the differential amplifier are interchanged with each other, and the circuit of FIG. 14 is such that the collectors of the transistors of the variable gain circuit are interchanged with each other. Further, the circuit of FIG. 13 may alternatively be rewritten in the manner of FIG. 15. In this case, it may be considered that the wirings of the feedback path from the collector to base of the first variable gain circuit are interchanged. Now, the explanation of the case where $I_A$ is smaller than zero is over.

As will be apparent from the foregoing description, the dividing operations are capable of being performed by the circuit of the fifth embodiment for $I_A$ larger than zero, and by the circuit of the sixth embodiment for $I_A$ smaller than zero. Therefore, if these two situations are switched according to the signs of the current $I_A$ automatically, a circuit is obtained for performing the dividing operation over the entire ranges except for zero and its vicinity of current $I_A$ regardless of the sign of the current $I_A$.

Figure 16:
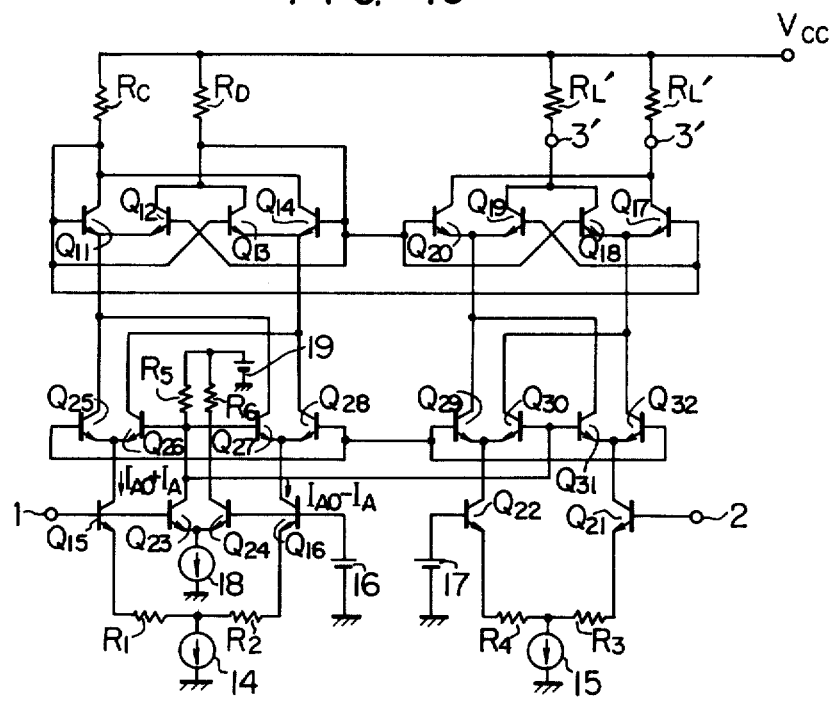
FIG. 16 is a circuit diagram showing a seventh embodiment of the present invention.

An example of such a circuit is shown as a seventh embodiment in FIG. 16. Additional component parts included in the seventh embodiment but not in the fifth embodiment are a current sign discriminator section for current $I_4$ including transistors $Q_{23}$ and $Q_{24}$, resistors $R_5$ and $R_6$ and a power supply 19, and a changeover section including transistors $Q_{25}$ to $Q_{28}$ and $Q_{29}$ to $Q_{32}$. When $I_4$ is larger than zero, the base potential of the transistor $Q_{15}$ should be higher than that of the transistor $Q_{16}$, and therefore the transistor $Q_{23}$ of the sign discriminator section conducts, and so do the transistors $Q_{25}$, $Q_{28}$, $Q_{29}$ and $Q_{32}$ of the change-over section. As a result, the same circuit as that of FIG. 10 is formed, thus making possible the dividing operation of the current $I_4$ larger than zero. When the current $I_4$ is smaller than zero, by contrast, the transistor $Q_{24}$ of the discriminator section conducts, and so do the transistors $Q_{36}$, $Q_{37}$, $Q_{30}$ and $Q_{31}$ of the change-over section. This forms the same circuit as FIG. 13, thus permitting the dividing operation for $I_4$ smaller than zero.

In switching between the circuits of FIGS. 10 and 14, the change-over section of the transistors $Q_{25}$ to $Q_{28}$ and $Q_{29}$ to $Q_{32}$ in FIG. 16 are arranged at the collector section of the transistors of the first to fourth variable gain circuits, the operation of which may be easily understood.

Figure 15:
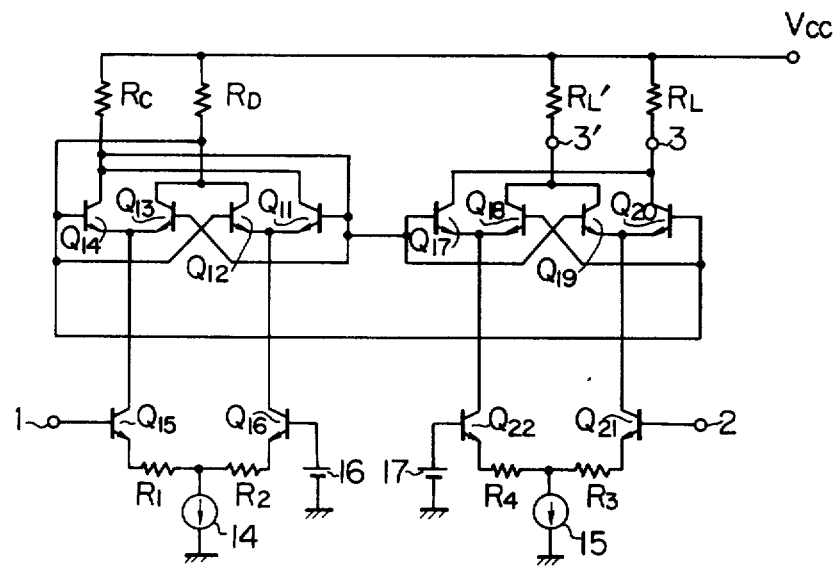
Figure 17:
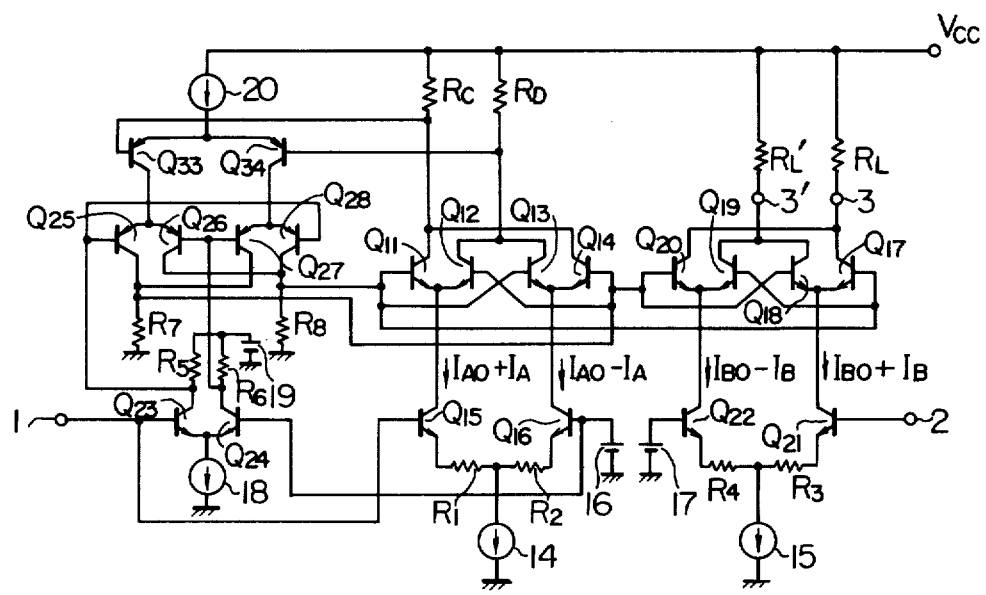
FIG. 17 is a circuit diagram showing an eighth embodiment of the present invention.

An eighth embodiment in which the circuits of FIGS. 10 and 15 are switched to each other will be explained with reference to FIG. 17. Additional component parts included in this embodiment but not included in the embodiments of FIG. 10 or FIG. 15 are a differential amplifier having the transistors $Q_{33}$ and $Q_{34}$ and a feedback switching section having transistors $Q_{25}$ to $Q_{28}$. If $I_4$ is larger than zero, the transistor $Q_{23}$ conducts and therefore the transistors $Q_{25}$ and $Q_{28}$ in the feedback switching section conduct, so that a feedback path of the same polarity as in FIG. 10 is formed. When $I_4$ is smaller than zero, by contrast, the transistor $Q_{24}$ conducts and so do the transistors $Q_{26}$ and $Q_{27}$, thus forming a feedback path of the same polarity as in FIG. 15. As a result, according to the sign of the current $I_4$, switching is automatically made between the circuits of FIGS. 10 and 15, thus performing the dividing operation.

The embodiments of FIGS. 5 to 8 may take various modifications, which will be illustrated below.

In a first modification, the constant voltage sources 16 and 17 are eliminated, the bases of the transistors $Q_{15}$ and $Q_{16}$ are impressed with the signal A as a differential input, and the bases of the transistors $Q_{21}$ and $Q_{22}$ are impressed with the signal as a differential input. The diagram of this circuit is shown in FIG. 8a. The operation of this circuit is the same as that of the fifth embodiment.

According to a second modification, the bases of the transistors $Q_{11}$ and $Q_{13}$ or the bases of the transistors $Q_{12}$ and $Q_{14}$ are connected to the constant voltage source 4. In this case, the feedback circuit connected to the constant voltage source 4, i.e., the resistor $R_C$ or $R_D$ used in the foregoing embodiments is not required.

In the fifth embodiment, the base voltage of the transistors $Q_2$ and $Q_4$ that is the voltage $V_2$ is fixed at the voltage expressed by equation (52).

$$V_2 = V_{cc} - \frac{R_C \cdot R_D}{R_C + R_D} \cdot 2I_{AO} \tag{52}$$

The difference between voltage $V_1$ and $V_2$ is very small as mentioned above and neglected. The equation (53) corresponding to equation (44) is obtained. From this, the currents $I_C$ and $I_D$ are given by equations (46) and (47) as in the previous case.

$$R_C \cdot I_C = \frac{R_C \cdot R_D}{R_C + R_D} \cdot 2I_{AO} \tag{53}$$

The operation of this modification is the same as that of the fifth embodiment mentioned above and therefore will not explained again.

Figure 18A:
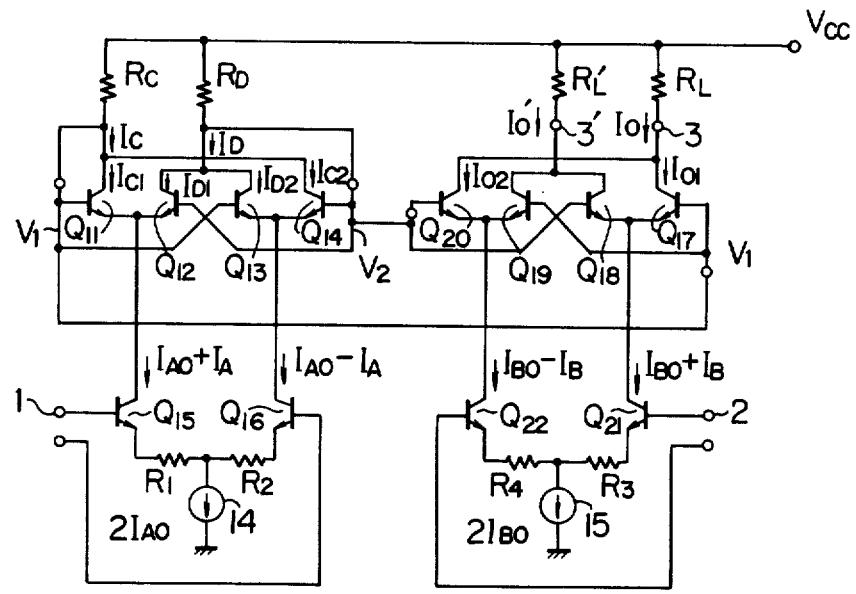
FIGS. 18a, 18b, 18c and 18d are circuit diagrams showing modifications of the fifth and sixth embodiments.
Figure 18B:
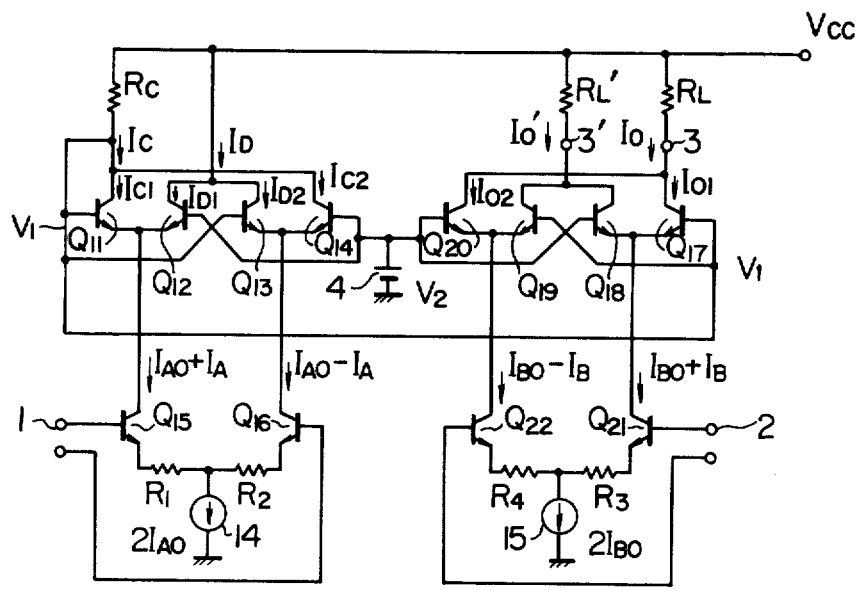
Figure 18C:
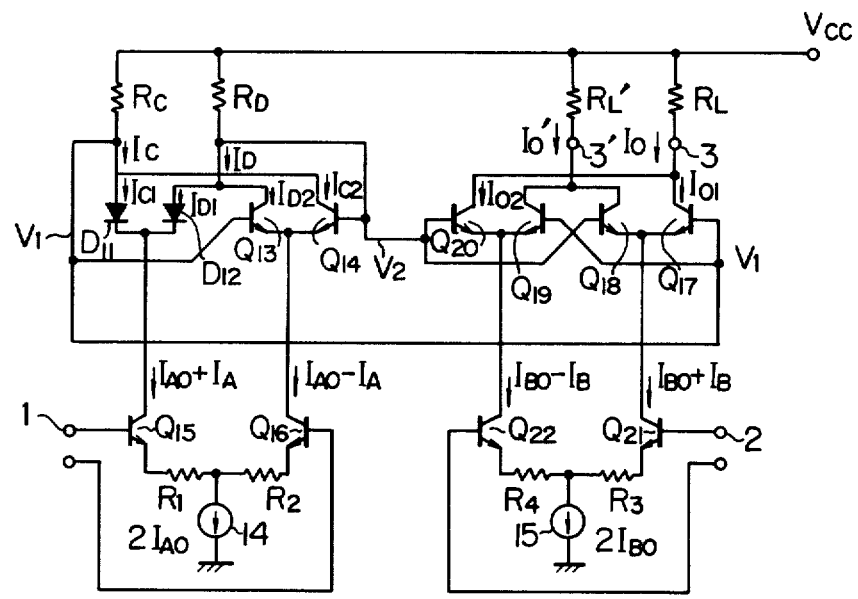
Figure 18D:
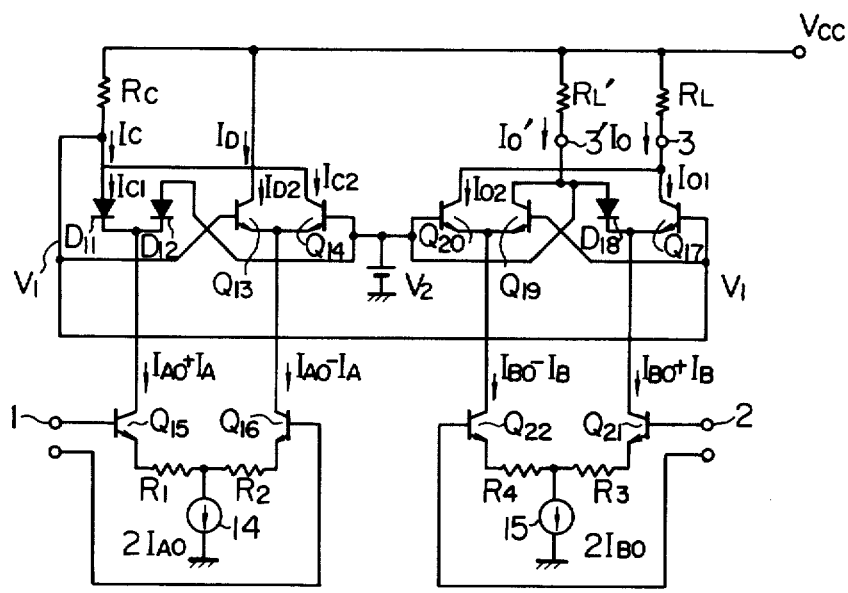

A third modification is such that the transistors of which the collector and the base are connected directly with each other, such as the transistors $Q_1$ and $Q_2$ in the fifth embodiment, are replaced by diodes. The diagram of FIG. 18c shows a circuit in which the transistors $Q_{11}$ and $Q_{12}$ of FIG. 18a are replaced by the diodes $D_{11}$ and $D_{12}$ respectively. Also, the diagram of FIG. 18d shows a circuit in which the transistors $Q_{11}$, $Q_{12}$ and $Q_{18}$ of FIG. 18b are replaced by the diodes $D_{11}$, $D_{12}$ and $D_{18}$ respectively.

It will thus be understood that according to the present invention, a system for dividing the signal B by the signal A is achieved by a very simple circuit configuration. Further, the circuit according to the present invention may be configured by a combination of differential amplifiers, thus facilitating a construction with integrated circuits.

I claim:

1. A divider circuit for dividing a second electrical signal by a first electrical signal, comprising:

a first variable gain circuit including a first differential amplifier having first and second transistors, a second differential amplifier having third and fourth transistors, a third differential amplifier having fifth and sixth transistors, first and second loads, a first current source, and first, second, third, and fourth terminals, the base of said first transistor being connected to said first terminal, the collector of said first transistor being connected to said first load on one hand and to the base of said first transistor by feedback means on the other hand, the base and the collector of said second transistor being connected to said second terminal, the base of said third transistor being connected to said first terminal, the collector of said third transistor being connected to said second terminal, the base of said fourth transistor being connected to said second terminal, the collector of said fourth transistor being connected to said first load, said second terminal being connected to said second load, the emitters of said first and second transistors being connected to the collector of said fifth transistor, the emitters of said third and fourth transistors being connected to the collector of said sixth transistor, the emitters of said fifth and sixth transistors being connected to said first current source, the base of said fifth transistor being connected to said third terminal, the base of said sixth transistor being connected to the fourth terminal;

a second variable gain circuit including a fourth differential amplifier having seventh and eighth transistors, a fifth differential amplifier having ninth and tenth transistors a sixth differential amplifier having 11th and 12th transistors, a second current source, and fifth, sixth, seventh, eighth, ninth and tenth terminals, the base of said seventh transistor being connected to the base of said ninth transistor on one hand and to said fifth terminal on the other hand, the base of said eighth transistor being connected to the base of said tenth transistor on one hand and to said sixth terminal on the other hand, the collector of said seventh transistor being connected to the collector of said tenth transistor on one hand and to the seventh terminal on the other hand, the collector of said eighth transistor being connected to the collector of said ninth transistor on one hand and to said eighth terminal on the other hand, the emitters of said seventh and eighth transistors being connected to the collector of said 11th transistor, the emitters of said ninth and tenth transistors being connected to the collector of said 12th transistor, the emitters of said 11th and 12th transistors being connected to said second current source, the base of said 11th transistor being connected to said ninth terminal, the base of said 12th transistor being connected to said tenth terminal;

first connection means for connecting said first terminal and said fifth terminal to each other;

second connection means for connecting said second terminal and said sixth terminal to each other;

first input means for applying the first electrical signal to said third and fourth terminals;

second input means for applying the second electrical signal to said ninth and tenth terminals; and output means for producing a third electrical signal from selected one of said seventh and eighth terminals.

2. A divider circuit according to claim 1, wherein said fourth terminal is connected with a third power supply, and said tenth terminal is connected with a fourth power supply.

3. A divider circuit according to claim 1, wherein said third terminal is connected with a third power supply, and said ninth terminal is connected with a fourth power supply.

4. A divider circuit according to claim 1, wherein said first variable gain circuit includes a first diode replacing said first transistor, the anode of said diode being connected to said first terminal, the cathode thereof being connected to the emitter of said second transistor.

5. A divider circuit according to claim 1, wherein said first variable gain circuit includes a second diode replacing said second transistor, the anode of said second diode being connected to said second terminal, the cathode thereof being connected to the emitter of said first transistor.

6. A divider circuit for dividing a second electrical signal by a first electrical signal, comprising:

a first variable gain circuit including a first differential amplifier having first and second transistors, a second differential amplifier having third and fourth transistors, a third differential amplifier having fifth and sixth transistors, a first load, a first current source, and first, second, third and fourth terminals, the base of said first transistor being connected to said first terminal, the collector of said first transistor being connected to said first load on one hand and to the base of said first transistor by feedback means on the other hand, the base of said second transistor being connected to said second terminal, the base of said third transistor being connected to said first terminal, the base of said fourth transistor being connected to said second terminal, the collector of said fourth transistor being connected to said first load, said second terminal being connected to said first power supply, the collectors of said second and third transistors being connected to said second power supply, the emitters of said first and second transistors being connected to the collector of said fifth transistor, the emitters of said third and fourth transistors being connected to the collector of said sixth transistor, the emitters of said fifth and sixth transistors being connected to said first current source, the base of said fifth transistor being connected to said third terminal, the base of said sixth transistor being connected to said fourth terminal;

a second variable gain circuit including a fourth differential amplifier having seventh and eighth transistors, a fifth differential amplifier having ninth and tenth transistors, a sixth differential amplifier having 11th and 12th transistors, a second current source, and fifth, sixth, seventh, eighth, ninth and tenth terminals, the base of said seventh transistor being connected to the base of said ninth transistor on one hand and to said fifth terminal on the other hand, the base of said eighth transistor being connected to said sixth terminal, the collector of said seventh transistor being connected to the collector of said tenth transistor on one hand and to said seventh terminal on the other hand, the collector of said eighth transistor being connected to said eighth terminal, the collector of said ninth transistor being connected to said eighth terminal, the base of said tenth transistor being connected to said sixth terminal, the emitters of said seventh and eighth transistors being connected to the collector of said 11th transistor, the emitters of said ninth and tenth transistors being connected to the collector of said twelfth transistor, the emitters of said 11th and 12th transistors being connected to a second current source, the base of said 11th transistor being connected to said ninth terminal, the base of said 12th transistor being connected to said tenth terminal;

first connection means for connecting said first terminal and said fifth terminal to each other;

second connection means for connecting said second terminal and said sixth terminal to each other;

first input means for applying the first electrical signal to said third and fourth terminals;

second input means for applying the second electrical signal to said ninth and tenth terminals; and output means for producing a third electrical signal from selected one of said seventh and eighth terminals.

7. A divider circuit according to claim 4, wherein said third terminal of said first and second input means is connected to a third power supply, said ninth terminal thereof being connected to a fourth power supply.

8. A divider circuit according to claim 4, wherein the fourth terminal of said first and second input means is connected to a third power supply, the tenth terminal thereof being connected to a fourth power supply.

9. A divider circuit according to claim 6, wherein said first variable gain circuit includes a first diode replacing said first transistor, the anode of said first diode being connected to said first terminal, the cathode thereof being connected to the emitter of said second transistor.

10. A divider circuit according to claim 6, wherein said first variable gain circuit includes a second diode replacing said second transistor, the anode of said second diode being connected to said second terminal, the cathode thereof being connected to the emitter of said first transistor.

11. A divider circuit according to claim 6, wherein said second variable gain circuit includes a third diode replacing said eighth transistor, the anode of said third diode being connected to said sixth terminal, the cathode thereof being connected to the emitter of said seventh transistor.

12. A divider circuit according to claim 1, wherein said first variable gain circuit includes a third power supply connected to said fourth terminal, a fourth power supply connected to said tenth terminal, discriminator means for discriminating the polarity of the first electrical signal applied to said third terminal, and first switch means adapted for cutting off the connection between the emitters of said first and second transistors and said fifth transistor and between the emitters of said third and fourth transistors and said sixth transistor at the same time, the emitters of said first and second transistors being connected to the collector of said sixth transistor on one hand and the emitters of said third and fourth transistors being connected to the collector of said fifth transistor on the other hand only when said connections are cut off, said switch means being controlled by said discriminator means.

13. A divider circuit for dividing a second electrical signal by a first electrical signal, comprising:
a first variable gain circuit including a first differential amplifier having first and second transistors, a second differential amplifier having third and fourth transistors, a third differential amplifier having fifth and sixth transistors, a first load, a first current source, first, second, third and fourth terminals, a third power supply connected to said fourth terminal, a fourth power supply connected to a tenth terminal, discriminator means for discriminating the polarity of the electrical signal applied to said third terminal, and second switch means, the base of said first transistor being connected to said first terminal, the collector of said first transistor being connected to the first load on one hand and to the base of said first transistor on the other hand, the base of said second transistor being connected to said second terminal, the collector of said second transistor being connected to said second load, the collector of said third transistor being connected to said second load, the base of said fourth transistor being connected to said second terminal, the collector of said fourth transistor being connected to said first load, said second terminal being connected to said second load, said second switch means being adapted for cutting off the connection between the base and the collector of said first transistor, and the connection between said second load and said second terminal at the same time, the base of said first transistor being connected to said second load on one hand and said second terminal being connected to the collector of said first transistor on the other hand when said connections are cut off, said discriminator means controlling said second switch means by the electrical signal, the emitters of said first and second transistors being connected to the collector of said fifth transistor, the emitters of said third and fourth transistors being connected to the collector of said sixth transistor, the emitters of said fifth and sixth transistors being connected to the first current source, the base of said fifth transistor being connected to said third terminal, the base of said sixth transistor being connected to said fourth terminal;
a second variable gain circuit including a fourth differential amplifier having seventh and eighth transistors, a fifth differential amplifier having ninth and tenth transistors, a sixth differential amplifier having 11th and 12th transistors, a third current source, and fifth, sixth, seventh, eighth, ninth and tenth terminals, the base of said seventh transistor being connected to the base of said ninth transistor on one hand and to said fifth terminal on the other hand, the base of said eighth tansistor being connected to the base of said tenth transistor on one hand and to said sixth terminal on the other hand, the collector of said seventh transistor being connected to the collector of said tenth transistor on one hand and to said seventh terminal on the other hand, the collector of said eighth transistor being connected to the collector of said ninth transistor on one hand and to said eighth terminal on the other hand, the emitters of said seventh and eight transistors being connected to the collector of said 11th transistor, the emitters of said ninth and tenth transistors being connected to the collector of said twelfth transistor, the emitters of said 11th and 12th transistors being connected to said second current source, the base of said 11th transistor being connected to said ninth terminal, the base of said 12th transistor being connected to said tenth terminal;
first connection means for connecting said first terminal and said fifth terminal to each other;
second connection means for connecting said second terminal and said sixth terminal to each other;
first input means for applying said first electrical signal to said third terminal;
second input means for applying said second electrical signal to said ninth terminal; and
output means for producing a third electrical signal from selected one of said seventh and eighth terminals.

14. A divider circuit for dividing a second electrical signal by a first electrical signal, comprising:
a first variable gain circuit including a first terminal supplied with the first electrical signal, a second terminal for producing an output voltage, a first current sharing means for sharing a current depending on the first electrical signal supplied to said first terminal into two currents, a first control means for generating a control voltage for controlling one of said shared currents at substantially a constant value regardless of the supplied first electrical signal, and a first supply means for supplying to said second terminal the control voltage generated by the first control means as an output voltage;
a second variable gain circuit including a third terminal supplied with the second electrical signal, a fourth terminal supplied with the output voltage of said first variable gain circuit, a fifth terminal for outputting an output signal generated by said second variable gain circuit, a second current sharing means for sharing a current depending on the second electrical signal supplied to the third terminal into two currents, a second control means for controlling the sharing ratio of the two currents shared by the second current sharing means by the output voltage of said first variable gain circuit applied to said fourth terminal and producing a third electrical signal which is the result of dividing said second electrical signal applied to said second variable gain circuit by said first electrical signal applied to said first variable gain circuit, and a second supply means for supplying the third electrical signal produced by the second control means to said fifth terminal;

connection means for connecting the second terminal of said first variable gain circuit to the fourth terminal of said second variable gain circuit; and output means for providing the third electrical signal as the output of the divider circuit from said fifth terminal of said second variable gain circuit.

* * * * *